(12) United States Patent
Yamazaki

(10) Patent No.: US 8,064,513 B2
(45) Date of Patent: Nov. 22, 2011

(54) PULSE GENERATOR, COMMUNICATION DEVICE, AND PULSE GENERATION METHOD

(75) Inventor: Takema Yamazaki, Suwa (JP)

(73) Assignee: Seiko Epson Corporation (JP)

( * ) Notice: Subject to any disclaimer, the term of this patent is extended or adjusted under 35 U.S.C. 154(b) by 847 days.

(21) Appl. No.: 12/039,880

(22) Filed: Feb. 29, 2008

(65) Prior Publication Data

US 2008/0212669 A1 Sep. 4, 2008

(30) Foreign Application Priority Data

Mar. 1, 2007 (JP) .................................. 2007-051231
Jan. 8, 2008 (JP) .................................. 2008-001050

(51) Int. Cl.
*H03K 7/08* (2006.01)

(52) U.S. Cl. ........ 375/238; 375/259; 375/295; 375/285; 375/340; 370/468; 370/311; 370/458; 370/445

(58) Field of Classification Search .................. 375/238, 375/259, 295, 285, 340; 370/468, 311, 458, 370/445
See application file for complete search history.

(56) References Cited

U.S. PATENT DOCUMENTS

| 2004/0233982 A1* | 11/2004 | Lee et al. ...................... 375/238 |
| 2006/0140253 A1* | 6/2006 | Maeki et al. .................. 375/146 |
| 2006/0170484 A1* | 8/2006 | Son .............................. 327/530 |
| 2008/0080270 A1* | 4/2008 | Cheng ........................... 365/194 |
| 2008/0248768 A1* | 10/2008 | Doi et al. ..................... 455/127.5 |

FOREIGN PATENT DOCUMENTS

| JP | 2004-336764 | 11/2004 |
| JP | 2005-012366 | 1/2005 |
| JP | 2006-074432 | 3/2006 |
| JP | 2007-142668 | 6/2007 |
| WO | WO 96/09694 | 3/1996 |
| WO | WO 2004/073195 | 8/2004 |

* cited by examiner

*Primary Examiner* — David C. Payne
*Assistant Examiner* — Zewdu Kassa
(74) *Attorney, Agent, or Firm* — Harness, Dickey & Pierce, P.L.C.

(57) ABSTRACT

A pulse generator which, by generating a carrier wave having a certain frequency over a predetermined unit duration time, generates a modulated pulse signal, having a pulse width regulated by the unit duration time, which bears information contained in a baseband signal, includes: a pulse width adjustment section which adjusts the pulse width by adjusting the unit duration time of the modulated pulse signal in accordance with a supplied pulse width control signal.

14 Claims, 25 Drawing Sheets

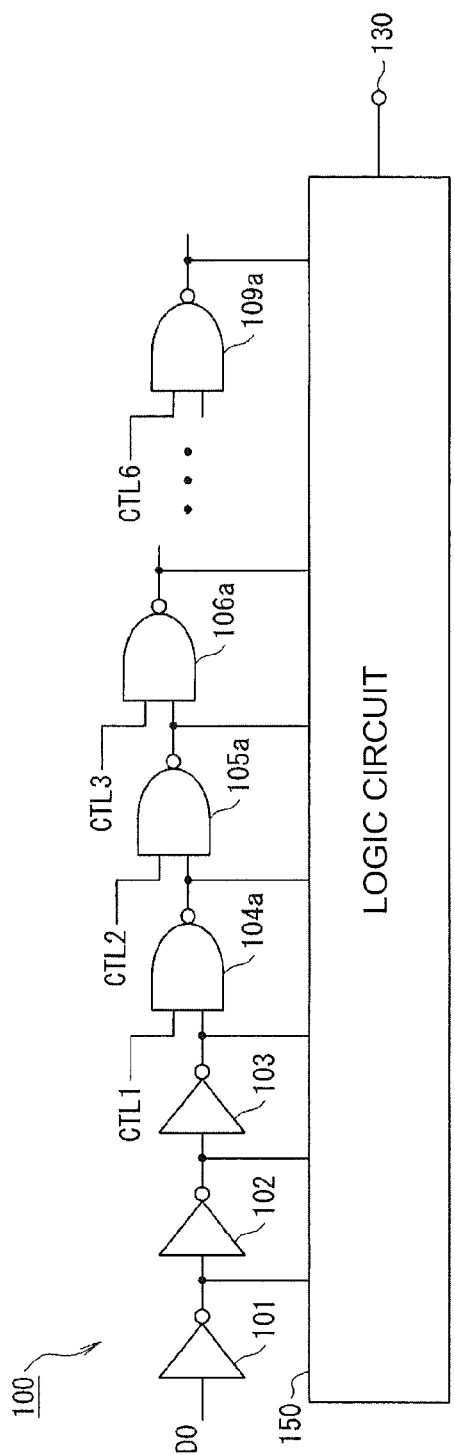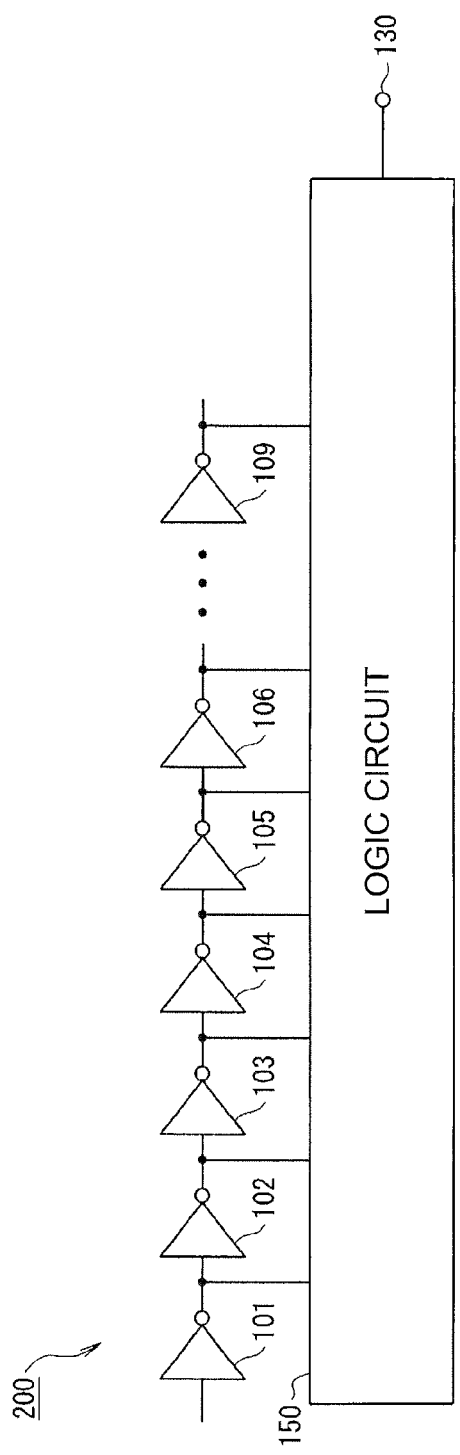
FIG. 1A
FIG. 1B

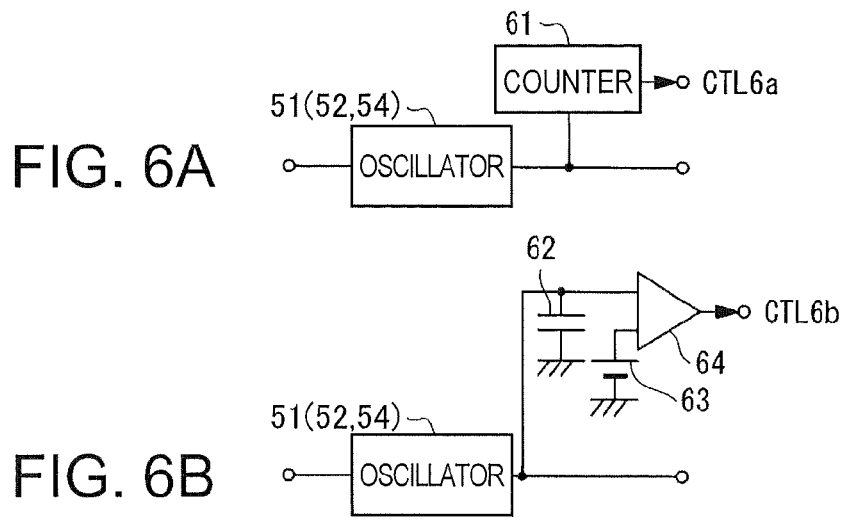
FIG. 6A
FIG. 6B
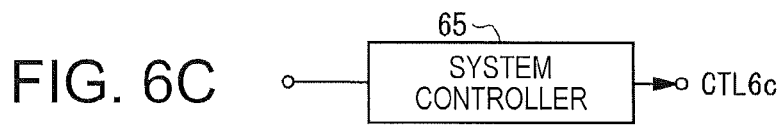
FIG. 6C
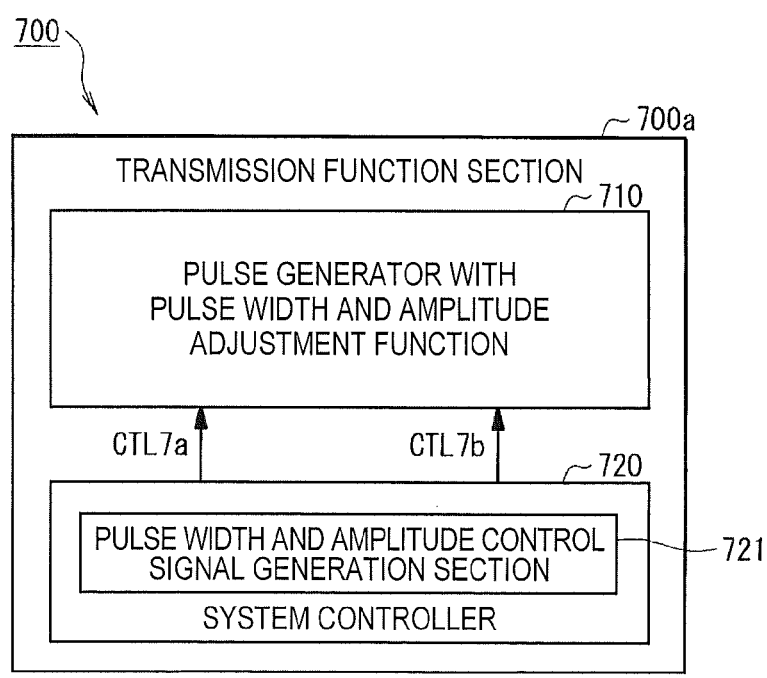
FIG. 7

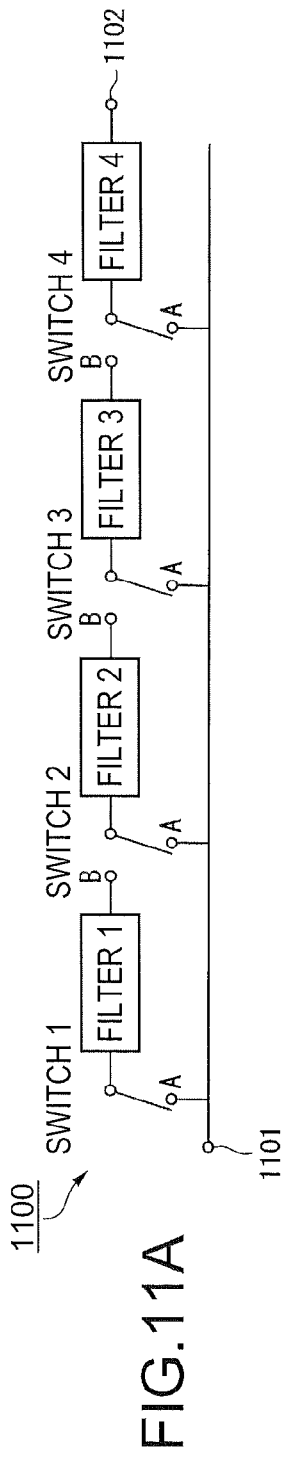
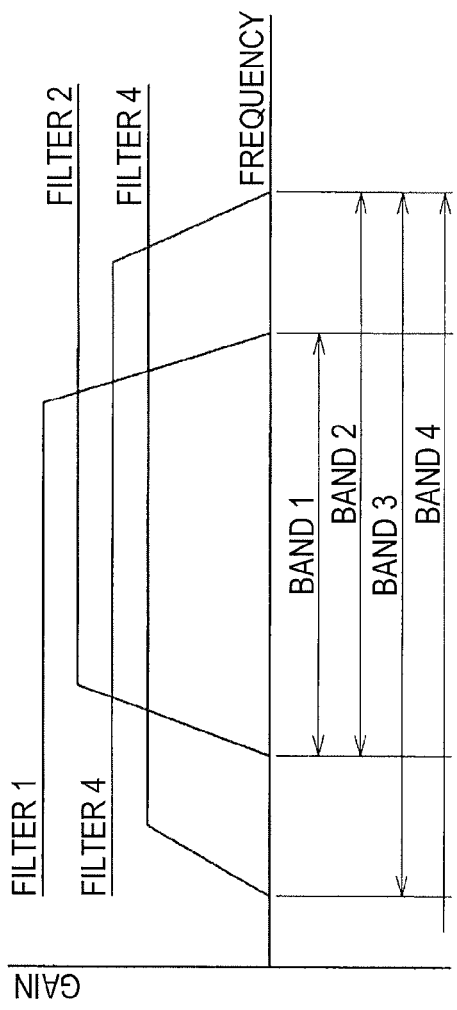
FIG.11A
FIG.11B
FIG.11C

| OPERATION OF ADJACENT WIRELESS SYSTEM | TRANSMISSION | RECEPTION | TRANSMISSION | RECEPTION |
|---|---|---|---|---|
| PULSE WIDTH | NARROW | WIDE | NARROW | WIDE |

FIG.20A

| OPERATION OF ADJACENT WIRELESS SYSTEM | TRANSMISSION | RECEPTION |
|---|---|---|
| PULSE WIDTH | ←——— WIDE ———→ | NARROW |

|  | PULSE PRIORITY HIGH | PULSE PRIORITY LOW |
|---|---|---|
| NOISE FROM CPU, LIQUID CRYSTAL OR THE LIKE HIGH | NARROW PULSE WIDTH IN ORDER TO HEIGHTEN PULSE COMMUNICATION QUALITY | WHEN DETECTING NOISE INDICATING THAT ANOTHER WIRELESS DEVICE IS IN PROCESS OF COMMUNICATION (FOR EXAMPLE, VOICE COMMUNICATION BY MOBILE PHONE), WIDEN PULSE WIDTH IN ORDER NOT TO OBSTRUCT THE COMMUNICATION |
| NOISE FROM CPU, LIQUID CRYSTAL OR THE LIKE LOW | MAKE OPTIMUM PULSE WIDTH FOR SYSTEM | MAKE OPTIMUM PULSE WIDTH FOR SYSTEM |

FIG.22

PULSE GENERATOR, COMMUNICATION DEVICE, AND PULSE GENERATION METHOD

BACKGROUND

1. Technical Field

The present invention relates to a pulse generator, a communication device and a pulse generation method which are applied to, for example, a wireless communication system using a pulse.

2. Related Art

Recently, wireless terminal devices such as a mobile phone and a wireless LAN have grown dramatically in popularity, and a frequency band used in communication therein has also extended to a GHz band. For this reason, there is a situation in which it is difficult to use a new frequency band for communication.

Under this kind of situation, a communication method using an impulse-like pulse and whose width is very narrow (for example, around 1 ns), has drawn attention as a new method of using frequency resources.

As this kind of communication method using the pulse, for example, a communication method described in JP-A-10-508725 (Abstract and FIG. 10) (hereafter referred to as Patent Document 1) has been proposed. In this communication method using the pulse, unlike a signal transmission using a normal continuous wave, an information transmission is carried out by means of an intermittent energy transmission and reception. This kind of communication method using the pulse, being of low power consumption and likely to achieve a miniaturization of the device, is suitable for a mobile device such as the mobile phone.

Also, the width of the pulse used to bear the information transmitted by means of the communication method using the pulse is very narrow, as heretofore described, and consequently, a frequency band of a frequency spectrum of the pulse becomes wider than in communication using the normal continuous wave, dispersing a signal energy.

As a result thereof, a signal energy per unit frequency band is minimized, there is less fear of causing interference with another communication system, and a sharing of the frequency band is taken to be possible.

However, a case in which another communication system is in proximity is not limited to this. For example, in a kind of case in which a communication system using the pulse and the other communication system are mixed in an identical casing of an electronic device, it may happen that communication between two-way devices in the communication system using the pulse exerts interference on the other communication system. In the same way, it may happen that the communication suffers interference from the other communication system.

Focusing attention on the heretofore described problem, a proposition for minimizing an interference signal directed to another device has also been made, for example, as shown in JP-A-2004-336764 (Paragraphs 0006 to 0013) (hereafter referred to as Patent Document 2).

That is, a technology of, in order to minimize power while guaranteeing a communication quality to some extent, detecting a signal-to-noise ratio (SNR) or a bit error rate (BER), and changing a coding rate, a modulation order (BPSK, QPSK), a pulse interval (a clock speed) or transmission power, is disclosed in Patent Document 2.

However, although the technology disclosed in Patent Document 2 is one which adapts a technique, which is also applied to a heretofore known wireless communication method which makes the coding rate, modulation order (BPSK, QPSK) or clock speed variable, to the communication using the pulse, in practice, it being insufficient as a measure against an interference wave in communication using a pulse having a very wide bandwidth, a possibility of a band used for that communication system extending into a band used by another communication cannot be eliminated.

SUMMARY

An advantage of some aspects of the invention is to provide a pulse generator, a communication device and a pulse generation method which, in a short distance communication, can suppress interference with a band used for another communication while taking advantage of features of communication using a pulse which is of low power consumption and high quality.

Aspects of the invention include those listed as follows.

1. A pulse generator which, by generating a carrier wave having a certain frequency over a predetermined unit duration time, generates a modulated pulse signal, having a pulse width regulated by the unit duration time, which bears information contained in a baseband signal, including: a pulse width adjustment section which adjusts the pulse width by adjusting the unit duration time of the modulated pulse signal in accordance with a supplied pulse width control signal.

In the pulse generator of 1, when the modulated pulse signal, having the pulse width regulated by the predetermined unit duration time, which bears the information contained in the baseband signal, is generated by generating the carrier wave having the certain frequency over the unit duration time, as a frequency band occupied by the modulated pulse signal is adjusted by the pulse width adjustment section adjusting the pulse width in accordance with the supplied pulse width control signal, it is possible, in a system configured applying the pulse generator, to suppress interference with a band used for another communication.

2. The pulse generator of 1, further: a pulse amplitude adjustment section which adjusts an amplitude of the carrier wave in accordance with the adjustment of the pulse width by the pulse width adjustment section.

In the pulse generator of 2, particularly in the pulse generator of 1, as the amplitude of the carrier wave is adjusted by the pulse amplitude adjustment section in accordance with the adjustment of the pulse width by the pulse width adjustment section, transmission power is adjusted to an appropriate value.

3. A communication device including: a pulse generator which, by generating a carrier wave having a certain frequency over a predetermined unit duration time, generates a modulated pulse signal, having a pulse width regulated by the unit duration time, which bears information contained in a baseband signal, including a pulse width adjustment section which adjusts the pulse width by adjusting the unit duration time of the modulated pulse signal in accordance with a supplied pulse width control signal; and a pulse width control signal generation section which generates the pulse width control signal.

In the communication device of 3, as the frequency band occupied by the modulated pulse signal is adjusted by adjusting the pulse width of the modulated pulse signal by means of the pulse width control signal generated by the pulse width control signal generation section included in its own device, it is possible to suppress interference with a band used by another communication.

4. The communication device of 3, in which the pulse width control signal generation section is configured in such a way as to generate the pulse width control signal in accordance with a value of one of a bit error rate, a signal-to-noise ratio, a received signal strength, which relate to a received signal, or an out-of-band noise.

In the communication device of 4, particularly in the communication device of 3, it is possible to adjust a width of an output pulse in accordance with the value of one of the BER, SNR, RSSI, which relate to the received signal, or out-of-band noise.

5. The communication device of 3, in which the pulse width control signal generation section is configured in such a way as to receive a signal emitted from an external electronic device, and generate the pulse width control signal in accordance with information the received signal bears.

In the communication device of 5, particularly in the communication device of 3, it is possible to adjust the output pulse width in accordance with the signal emitted from the external electronic device.

6. The communication device of 3, further including: an operating condition detection section which detects an operating condition in which an external communication device is in one of a transmission mode, a reception mode or a resting mode, the pulse width control signal generation section being configured in such a way as to generate the pulse width control signal in accordance with the operating condition detected by the operating condition detection section.

In the communication device of 6, particularly in the communication device of 3, it is possible to adjust the output pulse width in accordance with one of the transmission mode, reception mode or resting mode detected by the operating condition detection section.

7. The communication device of 6, in which the pulse width control signal generation section generates the pulse width control signal in such a way that the pulse width when the operating condition is in the transmission mode or the reception mode is wider than the pulse width in the resting mode.

In the communication device of 7, particularly in the communication device of 6, it is possible to suppress interference with an adjacent wireless system by making the pulse width in the transmission mode or reception mode longer than at a time of the resting mode.

8. The communication device of 6, in which the pulse width control signal generation section generates the pulse width control signal in such a way that the pulse width when the operating condition is in the reception mode is wider than the pulse width in the transmission mode.

In the communication device of 8, particularly in the communication device of 6, it is possible to suppress interference with the adjacent wireless system by making the pulse width in the reception mode longer than at a time of the transmission mode.

9. The communication device of 3, further including: a sensor which detects an amount of physical condition of an external electronic device, the pulse width control signal generation section being configured in such a way as to generate the pulse width control signal in accordance with the physical condition amount detected by the sensor.

In the communication device of 9, particularly in the communication device of 3, it is possible to adjust the output pulse width in accordance with the external electronic device physical condition amount detected by the sensor.

10. The communication device of 5, in which the pulse width control signal generation section is configured in such a way as to receive a pulse width adjustment request signal emitted from the external electronic device in accordance with a reception quality relating to the received signal, and generate the pulse width control signal in accordance with the received pulse width adjustment request signal.

In the communication device of 10, particularly in the communication device of 5, it is possible to adjust the output pulse width in accordance with a pulse width control signal emitted from an external electronic device which is a kind of communication device which adjusts the output pulse width in accordance with the reception quality relating to the received signal.

11. The communication device of 5, further including: a pulse width detection section which detects a pulse width applied to communication from a signal emitted from the external communication device, the pulse width control signal generation section being configured in such a way as to generate the pulse width control signal in accordance with the pulse width detected by the pulse width detection section.

In the communication device of 11, particularly in the communication device of 5, it is possible to detect the pulse width applied to the communication from the signal emitted from the external communication device, and adjust the output pulse width in accordance with the detected pulse width.

12. The communication device of 3, further including: a reception band adjustment section which adjusts a band of the received signal, based on the pulse width adjusted by the pulse width adjustment section.

In the communication device of 12, particularly in the communication device of 3, the band of the received signal is adjusted by the reception band adjustment section in accordance with the pulse width, adjusted by the pulse width adjustment section, of the pulse signal emitted from its own device.

13. The communication device of 3, further including: a remaining power level detection section which detects a remaining power level, the pulse width control signal generation section being configured in such a way as to generate the pulse width control signal in accordance with the remaining power level detected by the remaining power level detection section.

In the communication device of 13, particularly in the communication device of 3, it is possible to detect the remaining power level, and adjust the output pulse width in accordance with the detected remaining power level.

14. The communication device of 6, further including: a communication distance detection section which detects a communication distance from the external communication device, the pulse width control signal generation section being configured in such a way as to generate the pulse width control signal in accordance with the communication distance detected by the communication distance detection section.

In the communication device of 14, particularly in the communication device of 6, it is possible to detect the communication distance from the external communication device, and adjust the output pulse width in accordance with the detected communication distance.

15. The communication device of 3, further including: a pulse width signal reception section which receives a pulse width signal which, representing the pulse width, is transmitted; and a reception band adjustment section which adjusts the band of the received signal, based on the pulse width represented by the received pulse width signal.

In the communication device of 15, the reception band adjustment section adjusts the band of the received signal of its own device in accordance with a pulse width signal transmitted from a corresponding communication device.

16. The communication device of 3, in which a communication method is an ultra-wide band method.

17. A pulse generation method which, by generating a carrier wave having a certain frequency over a predetermined unit duration time, generates a modulated pulse signal, having a pulse width regulated by the unit duration time, which bears information contained in a baseband signal, including: adjusting the pulse width by adjusting the unit duration time of the modulated pulse signal in accordance with a supplied pulse width control signal.

In the pulse generation method of 17, when the modulated pulse signal, having the pulse width regulated by the predetermined unit duration time, which bears the information contained in the baseband signal is generated by generating the carrier wave having the certain frequency over the unit duration time, as a frequency band occupied by the modulated pulse signal is adjusted by adjusting the pulse width in accordance with the supplied pulse width control signal, it is possible, in a system configured applying the pulse generation method, to suppress interference with a band used by another communication.

18. A pulse generator, including: generating a pulse, regulated by a carrier wave on which information to be transmitted is superimposed and whose width is essentially equal to a length of a predetermined cycle of the carrier wave.

In the pulse generator of 18, as the pulse having a width essentially equal to the length of the predetermined cycle of the carrier wave is generated, it is possible, in a system configured applying the pulse generator, to suppress interference with a band used by another communication.

BRIEF DESCRIPTION OF THE DRAWINGS

The invention will be described with reference to the accompanying drawings, wherein like numbers reference like elements.

FIGS. 1A and 1B are circuit diagrams of a pulse generator according to embodiments.

FIGS. 6A to 6C are diagrams showing examples of circuits for generating control signals applied to the pulse generator according to the embodiments.

FIG. 7 is a block diagram representing a communication device according to the embodiments.

FIGS. 11A to 11C are diagrams representing still another configuration example of the bandwidth tunable filter.

FIGS. 20A and 20B are diagrams illustrating an aspect of an adjustment of a pulse width in the communication device according to the embodiments.

FIG. 22 is a diagram showing a relationship between a noise and the pulse width.

DESCRIPTION OF EXEMPLARY EMBODIMENTS

Figure 2:
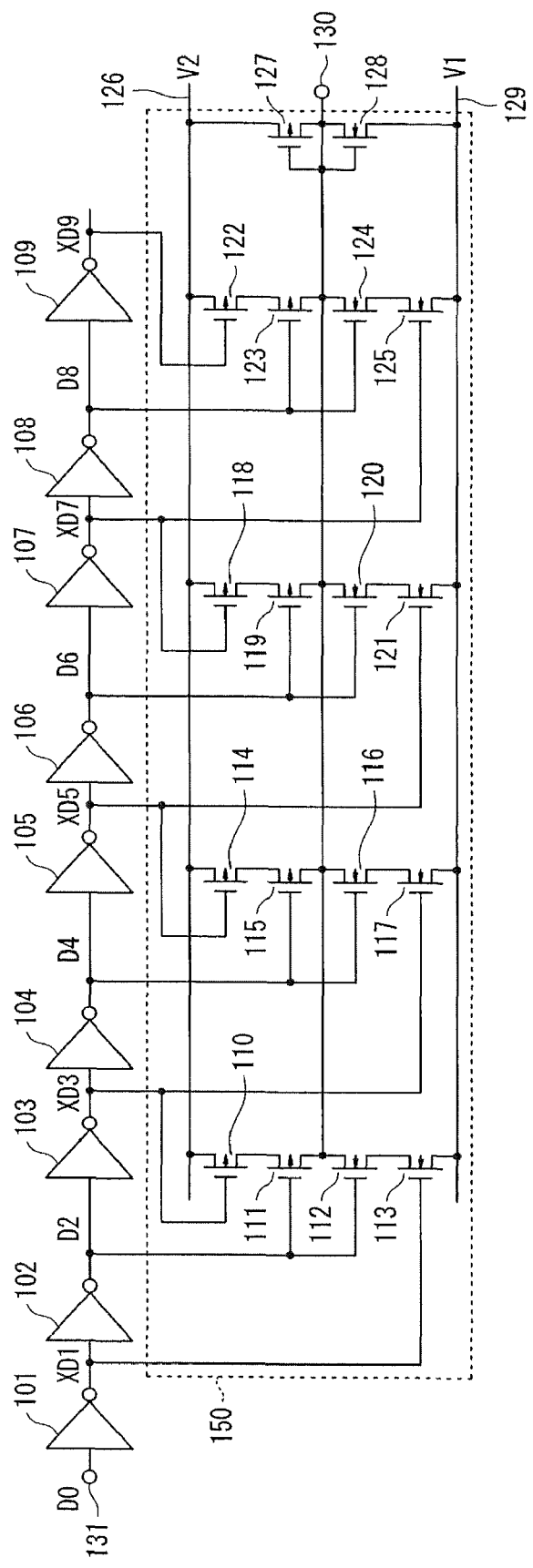
FIG. 2 is a circuit diagram representing details of a logic circuit of the pulse generator according to the embodiments.

Hereafter, a description will be given of embodiments of the invention, referring to the drawings. In the drawings to be referred to hereafter, for the sake of convenience, a main portion which is a subject of the description is appropriately heightened, and portions other than the main portion are simplified or omitted as appropriate.

FIGS. 1A and 1B are circuit diagrams of an embodiment belonging to a pulse generator in the embodiments. FIG. 1A represents a circuit of the pulse generator of the embodiments, and FIG. 1B is a diagram representing a pulse generator 200, to be referred to for illustrating the circuit of FIG. 1A, which is an original of a pulse generator 100 of FIG. 1A.

To facilitate description, a description will first be given of the pulse generator 200 of FIG. 1B.

Outputs from a plurality (nine in the example shown in the figure) of stages of inverters 101, 102, 103, 104, 105, 106, ... and 109, being configured in such a way as to be each input into a logic circuit 150, to be described hereafter with reference to FIG. 2, are transmitted as pulse signals which appear repeatedly in each predetermined period.

FIG. 2 is a circuit diagram representing the pulse generator 200, including a detail diagram of the logic circuit 150 in FIG.

Figure 3:
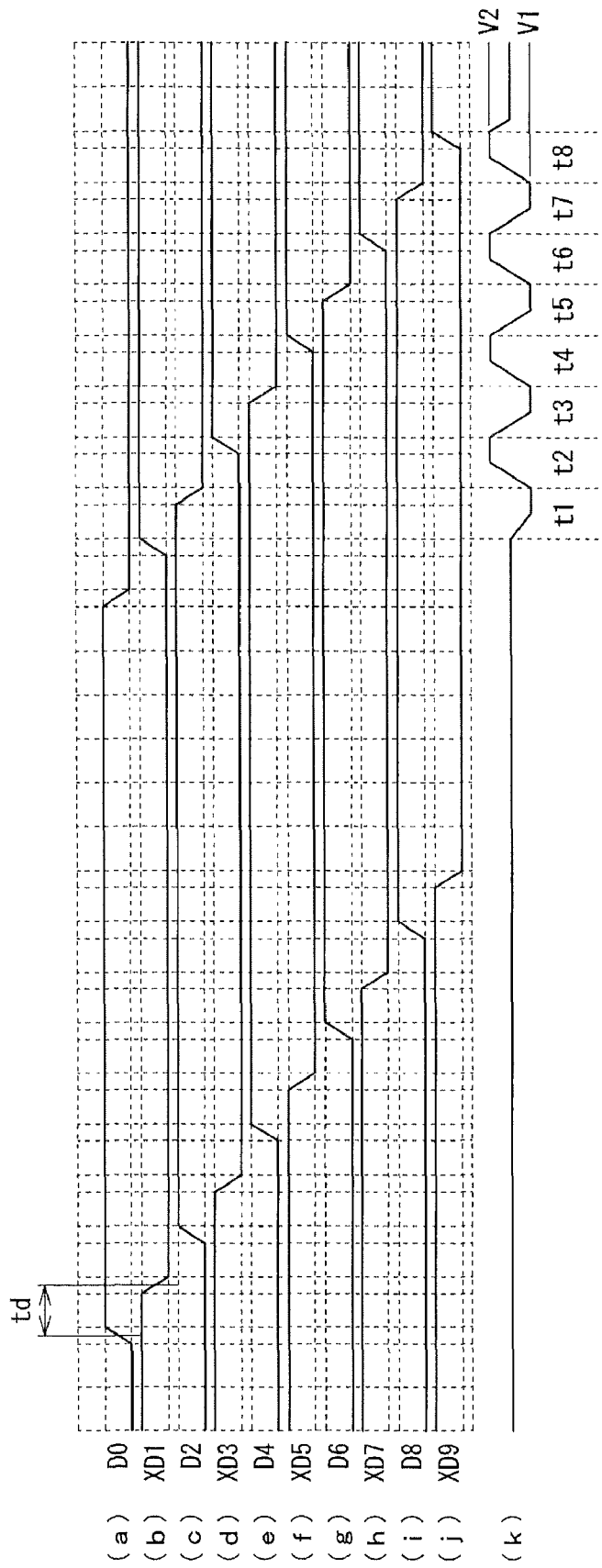
FIG. 3 is a diagram showing signal waveforms of portions in the pulse generator according to the embodiments.

1B. Also, (A) to (K) in FIG. 3 are signal waveform diagrams of portions of the pulse generator 200 of FIG. 2.

In FIG. 2, the inverters 101 to 109 are a delay circuit configured by cascading nine stages of inverters. A pulse $D_0$ input into an input terminal 131, as shown in (B) to (K) in FIG. 3, is delayed a time td in each stage, propagated through an inside of the delay circuit while a logic is being inverted, and transmitted from each stage. That is, supposing that a signal applied to the input terminal 131 is a positive logic, $XD_{2k-1}$, when i=2k-1, and $D_{2k}$, when i=2k, where k is a natural number, are transmitted to an i-th stage. Herein, X, representing a negative logic of the signal, is prefixed to a signal name.

N channel MOS transistors 113 and 112, when an output $XD_1$ from a first stage of the delay circuit and an output $D_2$ from a second stage are high, are electrically connected to each other, connecting a pulse output terminal 130 to a potential level V1.

Next, P channel MOS transistors 110 and 111, when the output $D_2$ from the second stage of the delay circuit and an output $XD_3$ from a third stage are low (that is, both a negative logic of $D_2$ and $XD_3$ are high (an AND is true)), are electrically connected to each other, connecting the pulse output terminal 130 to a second potential level V2.

In the same way, N channel MOS transistors 116, 117, 120, 121, 124 and 125, when an output $XD_{2k-1}$ from a (2k-1)-st stage of the delay circuit and an output $D_{2k}$ from a 2k-th stage are high, that is, when an AND of $XD_{2k-1}$ and $D_{2k}$ is true, are electrically connected to each other, connecting the pulse output terminal 130 to the first potential level V1.

Next, P channel MOS transistors 114, 115, 118, 119, 122 and 123, when the output $D_{2k}$ from the 2k-th stage of the delay circuit and an output $XD_{2k+1}$ from a (2k+1)-st stage are low, that is, an AND of $XD_{2k}$, which is a negation of $D_{2k}$, and $D_{2k+1}$, which is a negative logic of $XD_{2k+1}$, is true, are electrically connected to each other, connecting the pulse output terminal 130 to the second potential level V2.

By means of the heretofore described kind of operation, it is possible to generate a kind of pulse waveform shown in (K) in FIG. 3.

Although the pulse generator 200 of FIG. 1B, the details of which are described in FIG. 2, is configured and operated in the way heretofore described, the circuit of the pulse generator 100 of the embodiments in FIG. 1A is configured by replacing the inverters 104 to 109, in the cascade circuit of the inverters 101, 102, 103, 104, 105, 106, . . . and 109 in a circuit configuration of the pulse generator 200 of FIG. 1B, with NAND circuits 104a, 105a, 106a, . . . and 109a.

As shown in the figure, the inverters 104 to 109 are replaced with the NAND circuits 104a, 105a, 106a, . . . and 109a in a relationship in which input ends of the NAND circuits 104a to 109a correspond to input ends of the inverters 104 to 109, and output ends of the NAND circuits 104a to 109s correspond to output ends of the inverters 104 to 109, and a configuration is such that pulse width control signals CTL1, CTL2, CTL3, . . . and CTL6 are supplied to the other ends of the NAND circuits 104a, 105a, 106a, . . . and 109a, respectively.

In accordance with an existence or otherwise of the supply of the pulse width control signals CTL1, CTL2, CTL3, . . . and CTL6 (a condition of an HL of a pulse signal level), it is determined whether or not the corresponding NAND circuits 104a, 105a, 106a, . . . and 109a function as the inverters, with a result that a kind of carrier wave number in each pulse, in each predetermined cycle, shown in (K) in FIG. 3, is selected.

The above operation will be further described, with appropriate reference to FIGS. 21A to 21D representing a principled operation common in each embodiment. In the following description, the "pulse width" relating to an output signal generated by the pulse generator of the embodiments is a predetermined unit duration time in a condition in which an operation of continuously generating a carrier wave having a certain frequency over the predetermined unit duration time is intermittently repeatedly carried out.

Figure 21A:
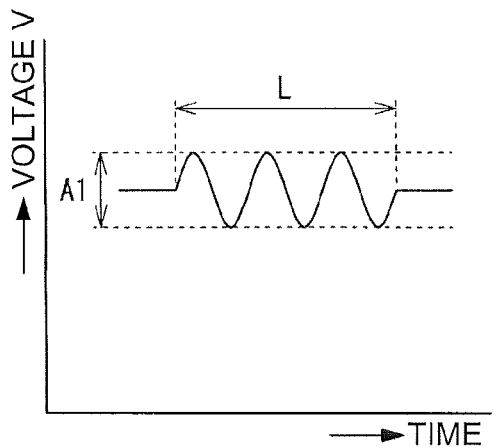
FIGS. 21A to 21D are diagrams representing an operation relating to a principle of the invention.
Figure 21C:
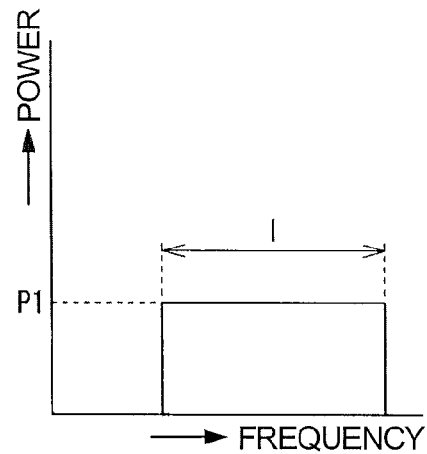
Figure 21B:
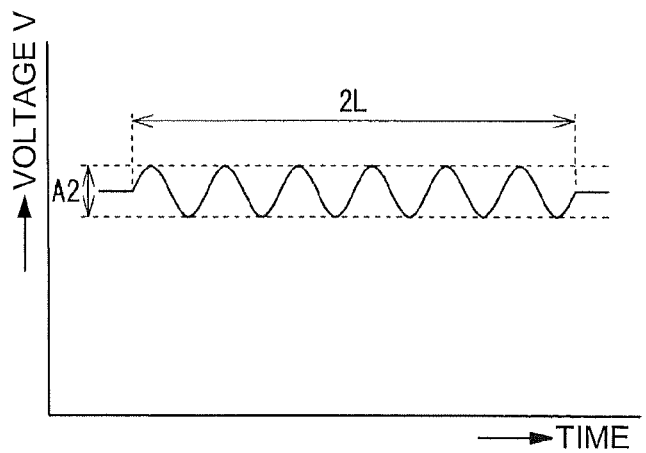

FIGS. 21A to 21D are diagrams representing an operation relating to a principle in the embodiments. FIGS. 21A and 21B are each diagrams representing aspects of carrier waves generated in such away as to form different pulse widths.

FIGS. 21A and 21B represent the aspects of the carrier waves in a case of a pulse width L, and in a case of a pulse width 2L, to facilitate description, only by one symbol period.

In the pulse generator of the embodiments, by continuously generating the carrier wave having the certain frequency, in each appropriate one of sequential symbol periods, over a predetermined unit duration time within the symbol period, an intermittent modulated pulse signal is generated which, as well as having a pulse width (L or 2L) regulated by the unit duration time, bears information contained in each corresponding segment of a baseband signal.

As shown in FIGS. 21A and 21B, a pulse width is selectively generated, such as by selecting L or 2L, but in the circuit of the pulse generator of the embodiments in FIG. 1A, this is selected by, in accordance with the existence or otherwise of the supply of the control signals CTL1, CTL2, CTL3, . . . and CTL6 (the condition of the HL of the pulse signal level), switching those of the corresponding NAND circuits 104a, 105a, 106a, . . . and 109a, in order from the top, which function effectively as the inverters.

That is, in the pulse generator of the embodiments in FIG. 1A, the NAND circuits 104a, 105a, 106a, . . . and 109a, provided in such a way that the control signals CTL1, CTL2, CTL3, . . . and CTL6 are supplied to the other of their own input ends, configure a pulse width adjustment section of the pulse generator.

Particularly in the examples of FIGS. 21A and 21B, a pulse width is selected in such a way that it is an integral multiple of a carrier wave cycle, such as three times wider than the carrier wave cycle in the former example, or six times wider in the latter. However, in a technological idea of the invention, in selecting a pulse width, it is not essential to select an integral multiple of the carrier wave cycle.

Figure 21D:
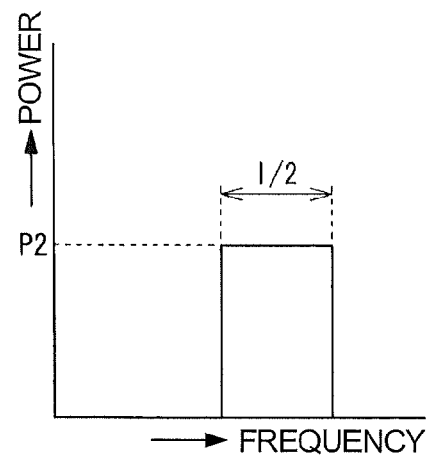

As in the embodiments, on adjusting the pulse width, in a case of FIG. 21A in which the pulse width is relatively narrow, a frequency band occupied by this pulse (the modulated pulse signal resulting from the carrier wave) becomes relatively wide, as represented in FIG. 21C. On the other hand, in a case of FIG. 21B in which the pulse width is relatively wide, a frequency band occupied by this pulse (the modulated pulse signal) becomes relatively narrow, as represented in FIG. 21D.

The heretofore described pulses are suitable for an ultra-wide band (UWB) which is one of communication methods. In a communication device of the embodiments, there is further provided a pulse amplitude adjustment section which adjusts an amplitude of the carrier wave in accordance with the adjustment of the pulse width by the pulse width adjustment section.

In a case in which, by providing this kind of pulse amplitude adjustment section, the pulse width L becomes relatively narrow, as represented in FIG. 21A, and consequently, an occupied frequency band 1 becomes wider, as represented in FIG. 21C, an amplitude A1 of the carrier wave is adjusted to be relatively large. On the other hand, in a case in which the pulse width 2L becomes relatively wide, as represented in FIG. 21B, and consequently, an occupied frequency band ½ becomes narrower, as represented in FIG. 21D, it being possible to adjust an amplitude A2 of the carrier wave to be relatively small, transmission power is adjusted to an appropriate value.

Figure 29:
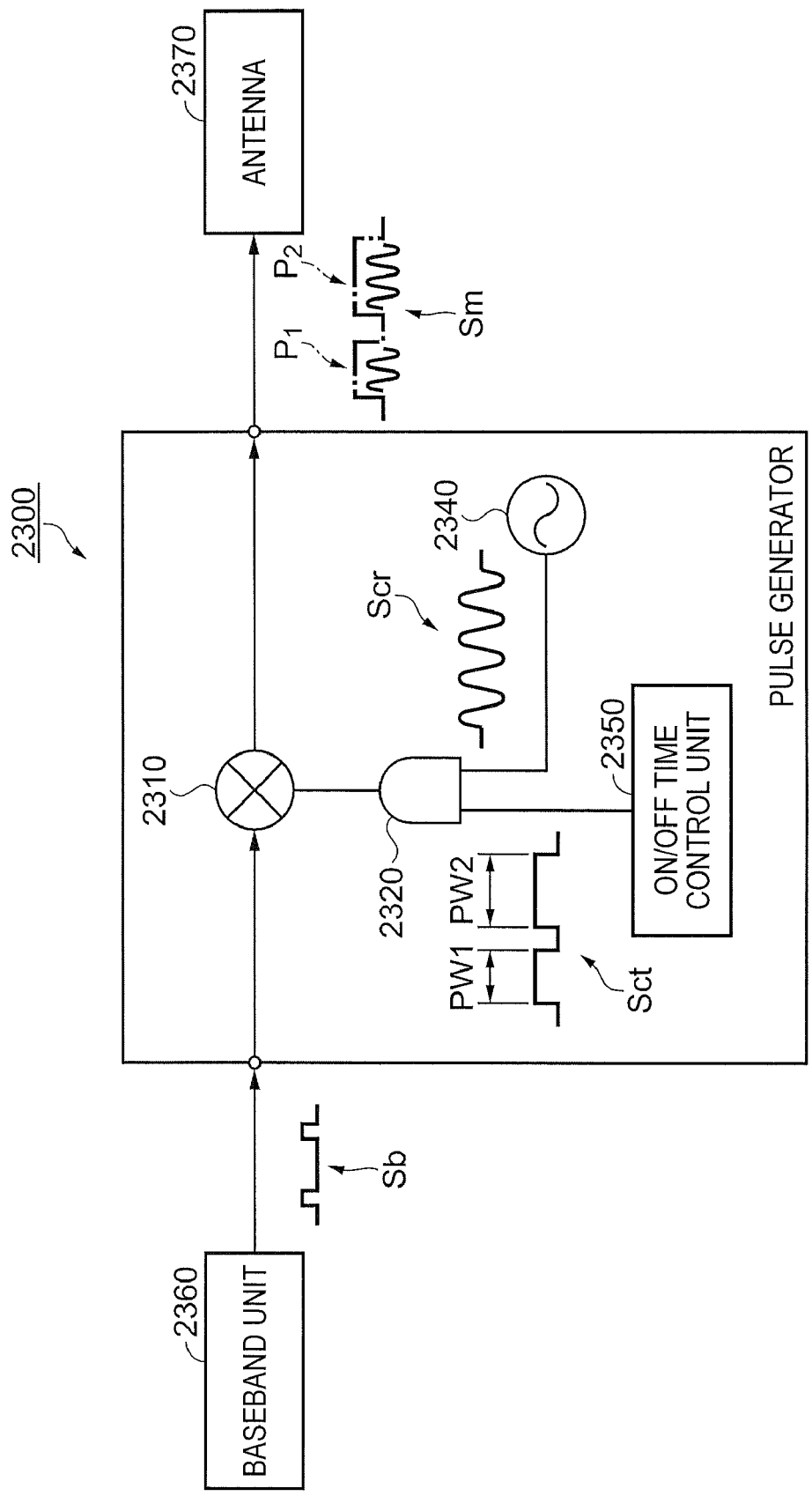
FIG. 29 is a diagram showing a principle of the pulse generator according to the embodiments.

FIG. 29 is a diagram showing a principle of a pulse generator 2300. The pulse generator 2300, by modulating a carrier wave Scr by means of a baseband signal Sb received from a baseband unit 2360, transmits a modulated pulse signal Sm. More specifically, in the pulse generator 2300, a local oscillator 2340 continuously generates the carrier wave Scr, an on/off time control unit 2350 regulates, for example, a length of a pulse width PW1 and a length of a pulse width PW2, by means of a pulse width control signal Sct, and an AND circuit 2320 transmits the carrier wave Scr by an amount equivalent to the length of the pulse width PW1 and the length of the pulse width PW2. Continuing, a mixer 2310, by multiplying together the baseband signal Sb and the carrier wave Scr transmitted from the AND circuit 2320, generates the modulated pulse signal Sm containing, for example, a pulse P1, formed of two cycles of the carrier wave Scr (two carrier waves Scr), which has a width equal to the pulse width PW1, and a pulse P2, formed of three cycles of the carrier wave Scr (three carrier waves Scr), which has a width equal to the pulse width PW2, and transmits the modulated pulse signal Sm generated to an antenna 2370.

Figure 4:
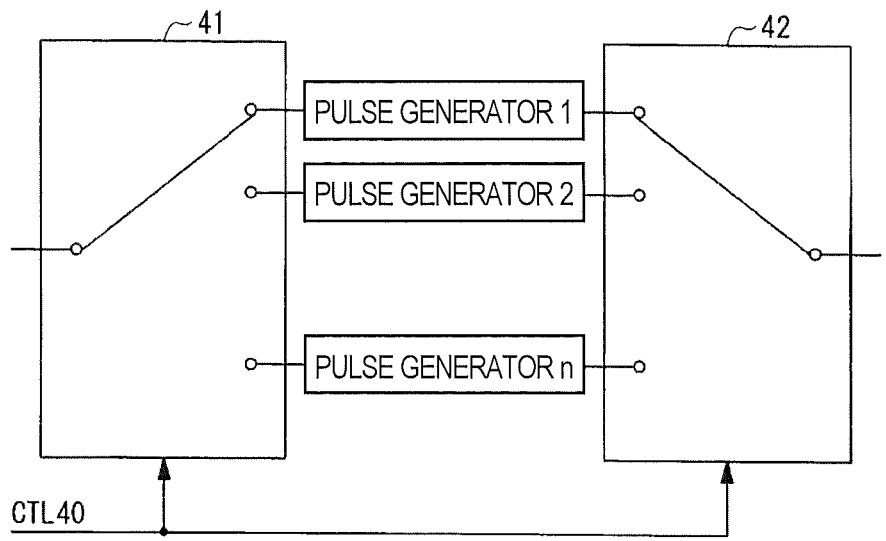
FIG. 4 is a diagram representing another embodiment of the pulse generator according to the embodiments.

FIG. 4 is a diagram representing another embodiment of the pulse generator. A pulse generator of FIG. 4 being, for example, the kind of pulse generator in FIG. 1B, a pulse width of the output signal is selectively switched by one of a plurality n of pulse generators 1, 2, ... and n, which have different numbers of inverter cascade stages, functioning selectively and effectively by means of a pulse supply selector switch 41 and an output pulse selector switch 42, which switch selectively between an output and an input in response to a pulse width control signal CTL40.

That is, each of the pulse generator 1, the pulse generator 2, ... and the pulse generator n continuously generating a carrier wave having a certain frequency, over a different unit duration time, in accordance with the number v of inverter cascade stages, one of them functions selectively.

Figure 5A:
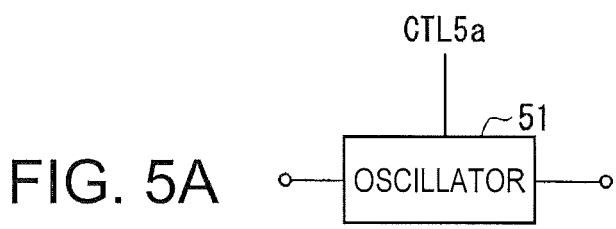
FIGS. 5A to 5C are diagrams showing examples of circuits for generating control signals applied to the pulse generator according to the embodiments.
Figure 5B:
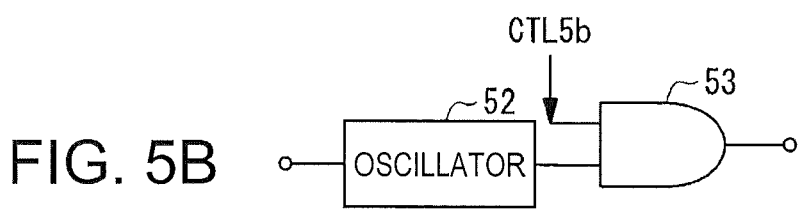
Figure 5C:
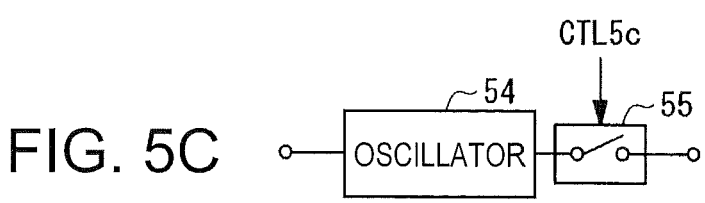

FIGS. 5A to 5C are diagrams representing still other embodiments of the pulse generator. A pulse generator of FIG. 5A is configured in such a way as to supply a control signal (a pulse width control signal) CTL5a to an oscillator 51 which, during operation, continuously generates a carrier wave having a certain frequency, and to adjust a pulse width by controlling a starting and stopping of the operation of the oscillator 51 in accordance with the supplied control signal CTL5a.

A pulse generator of FIG. 5B is configured in such a way as to, a gate circuit (an AND gate) 53 being connected to an output side of an oscillator 52 which continuously generates a carrier wave having a certain frequency, adjust a pulse width of a signal obtained at an output end of the gate circuit 53, by controlling a make and break of the gate circuit 53 by means of a control signal (a pulse width control signal) CTL5b.

A pulse generator of FIG. 5C is configured in such a way as to, a switch circuit 55 being connected to an output side of an oscillator 54 which continuously generates a carrier wave having a certain frequency, adjust a pulse width of a signal obtained at an output end of the switch circuit 55, by controlling a make and break of the switch circuit 55 by means of a control signal (a pulse width control signal) CTL5c.

FIGS. 6A to 6C are diagrams showing examples of circuits for generating the control signals (pulse width control signals) applied to the pulse generators of FIGS. 5A to 5C.

The control signal generation circuit of FIG. 6A counts a carrier wave number in a pulse, transmitted from the oscillator 51 (52, 54) of FIG. 5A (5B, 5C), by means of a counter 61 and, based on a count value, emits a control signal (a pulse width control signal) CTL6a used as the signal CTL5a, which causes an operation of the oscillator 51 to continue by a value commensurate with a unit duration time which is an expected pulse width, the signal CTL5b, which puts the gate circuit (AND gate) 53 into a broken condition, or a kind of signal CTL5c, which makes the switch circuit 55.

The control signal generation circuit of FIG. 6B integrates the pulse (carrier wave), transmitted from the oscillator 51 (52, 54) of FIG. 5A (5B, 5C), by means of a capacitor 62, compares an integration value and a reference voltage 63 (the reference voltage 63 itself is also variable in accordance with conditions) by means of a comparator 64 and, based on a comparison result, emits a control signal (a pulse width control signal) CTL 6b used as the signal CTL5a which causes the operation of the oscillator 51 to continue by the value commensurate with the unit duration time which is the expected pulse width, the signal CTL5b which puts the gate circuit (the AND gate) 53 into the broken condition, or the kind of signal CTL5c, which makes the switch circuit 55.

The control signal generation circuit of FIG. 6C is configured in such a way that a portion emitting the control signal (pulse width control signal) CTL6c is provided, as one function section, in a system controller 65 which centrally controls a whole of the communication device.

FIG. 7 is a block diagram representing an embodiment belonging to the communication device. In FIG. 7, particularly, a transmission function section 700a, which is a main portion in a communication device 700, is represented. The communication device 700 applies a pulse generator 710 which has the kind of pulse width adjustment function section described with reference to FIGS. 1A to 6, and further has the pulse amplitude adjustment section which adjusts the amplitude, as described with reference to FIGS. 21A to 21D. Then, the communication device 700 is configured in such a way as to supply a pulse width control signal CTL7a, for the pulse width adjustment, and an amplitude control signal CTL7b, for the amplitude adjustment, to the pulse generator 710 from a pulse width and amplitude control signal generation section 721 in a system controller 720 which centrally controls a whole system of the communication device 700.

In the communication device 700, by causing the pulse generator 710, applied to its own transmission function section 700a, to continuously generate a carrier wave having a certain frequency, in each appropriate one of sequential symbol periods, over a predetermined unit duration time within the symbol period, an intermittent modulated pulse signal is generated which, having a pulse width regulated by the unit duration time, bears information in a corresponding segment of a baseband signal.

In this case, the pulse width, which is the unit duration time of the modulated pulse signal, and the amplitude are adjusted based on the pulse width and amplitude control signals supplied from the pulse width and amplitude control signal generation section 721 in the system controller 720.

As a frequency band occupied by the modulated pulse signal is adjusted by means of the adjustment, it is possible, in a system configured applying this pulse generator, to suppress interference with a band used by another communication. Furthermore, as the carrier wave amplitude is adjusted in accordance with the adjustment of the pulse width of the modulated pulse signal by the pulse width adjustment section, the transmission power can be adjusted to the appropriate value.

For example, as represented in FIGS. 21C and 21D, in the event that the pulse width is widened from the kind of pulse width L in FIG. 21A to the pulse width 2L which is twice wider, as in FIG. 21B, as well as the occupied band being narrowed to ½, as in FIG. 21D, the power is doubled. Consequently, the carrier wave amplitude is narrowed to a square root of ½, inhibiting the transmission power from increasing further and departing from a regulation value.

The technology relating to the communication device, described with reference to FIG. 7, not being limited only to a case in which the transmission function section 700a is configured in the communication device 700 of FIG. 7 in the way heretofore described, it is needless to say that it is a technological idea which also includes a case in which the transmission function section 700a is configured as a single transmission device (that is, that kind of communication device).

Figure 8:
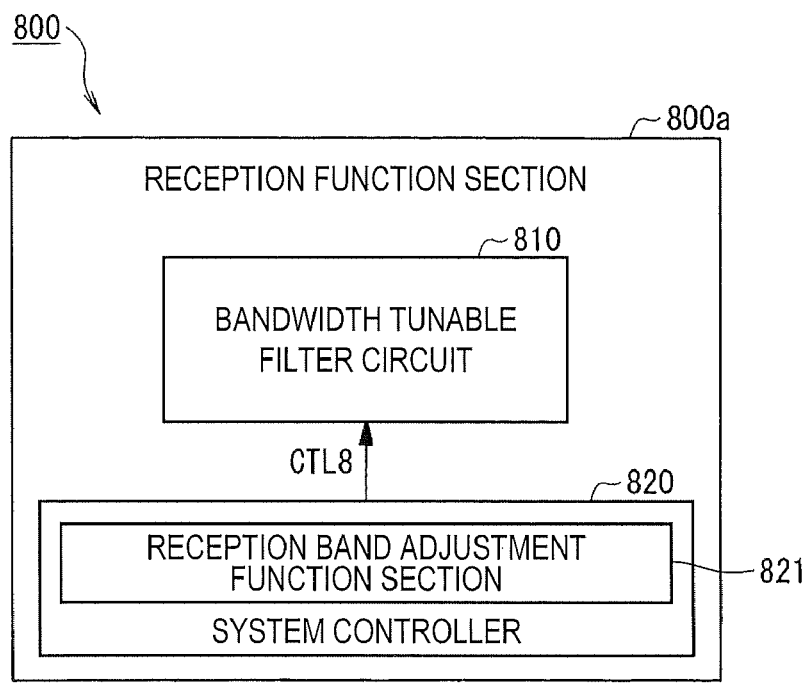
FIG. 8 is a block diagram representing a communication device according to the embodiments.

FIG. 8 is a block diagram representing another embodiment belonging to the communication device. In FIG. 8, particularly, a reception function section 800a, which is a main portion of a communication device 800, is represented. It is also acceptable that a transmission function section of the communication device 800 is configured in the same way as the transmission function section 700a described with reference to FIG. 7.

The communication device 800 includes, in its own reception function section, a reception band adjustment section which, when a pulse width, which is the unit duration time of the modulated pulse signal, and an amplitude are adjusted in a transmission function section of an external communication device of the same kind, receives a signal, emitted from the external communication device, which represents an adjustment value of the pulse width of the modulated pulse signal, and adjusts a band of the received signal in such a way as to correspond to the adjustment value of the pulse width.

That is, a configuration is such that a bandwidth tunable filter circuit 810 acting as the reception band adjustment section, which adjusts the band of the received signal, is supplied with a reception band control signal CTL8, which adjusts a passband of the filter circuit 810, from a reception band adjustment function section 821 in a system controller 820 which centrally controls a whole system of the communication device 800.

In the communication device of FIG. 8 too, as its transmission function section has the same configuration as the transmission function section in the communication device of FIG. 7, when, by continuously generating a carrier wave having a certain frequency, in each appropriate one of sequential symbol periods, over a predetermined unit duration time within the symbol period, an intermittent modulated pulse signal is generated which, having a pulse width regulated by the unit duration time, bears information in a corresponding segment of a baseband signal, as a frequency band occupied by the modulated pulse signal is adjusted by adjusting the unit duration time of the modulated pulse signal by means of a pulse width adjustment section in accordance with a pulse width control signal supplied from a pulse width control signal generation section, it is possible, in a system configured applying this pulse generator, to suppress interference with a band used by another communication.

Also, the band of the received signal is adjusted by the reception band adjustment section (the bandwidth tunable filter circuit 810 and the reception band adjustment function section 821) included in the reception function section of its own device in such a way as to correspond to the adjustment value of the pulse width. For this reason, it is possible to adjust a frequency band relating to a reception in such a way as to minimize a suffering from interference with another communication.

The technology relating to the communication device, described with reference to FIG. 8, not being limited only to a case in which the reception function section 800a is configured in the communication device 800 of FIG. 8 in the way heretofore described, it is needless to say that it is a technological idea which also includes a case in which the reception function section 800a is configured as a single reception device (that is, that kind of communication device).

Figure 9:
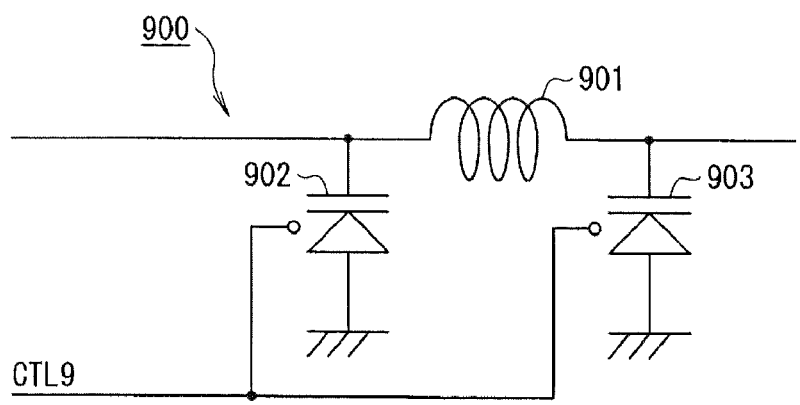
FIG. 9 is a diagram representing a configuration example of a bandwidth tunable filter.

FIG. 9 is a diagram representing a configuration example of the bandwidth tunable filter circuit 810 in FIG. 8. In FIG. 9, the bandwidth tunable filter circuit is allotted with a new reference numeral 900. As shown in the figure, the bandwidth tunable filter circuit 900 is configured in such a way that ends of varactors (variable capacitors) 902 and 903 are connected to an input end and output end of an inductor 901, respectively, while the other ends of the varactors 902 and 903 are grounded, and that a control signal CTL9, the same as the reception band control signal CTL8 in FIG. 8, is supplied to the varactors 902 and 903, and a passband of the bandwidth tunable filter circuit 900 is changed by adjusting their capacitance values.

Figure 10:
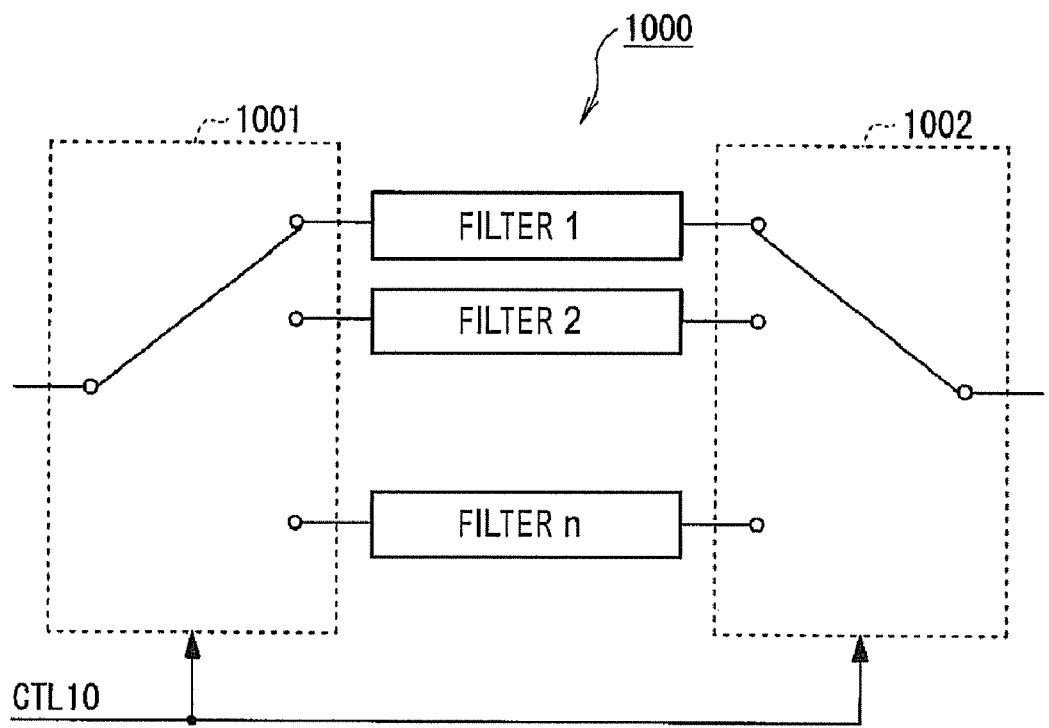
FIG. 10 is a diagram representing another configuration example of the bandwidth tunable filter.

FIG. 10 is a diagram representing another configuration example of the bandwidth tunable filter circuit 810 in FIG. 8. In FIG. 10, the bandwidth tunable filter is allotted with a new reference numeral 1000. The bandwidth tunable filter 1000 configures a so-called filter bank, in which an input changing-over switch 1001 and an output changing-over switch 1002 are provided respectively on an input side and output side of n filters 1, 2, . . . and n having different pass characteristics, and is configured in such a way that one of the n filters is selectively applied by the changing-over switches 1001 and 1002 being switched and controlled by means of a control signal CTL10, the same as the reception band control signal CTL8 in FIG. 8.

FIGS. 11A to 11C are diagrams representing still another configuration example of the bandwidth tunable filter circuit 810 in FIG. 8. In FIGS. 11A to 11C, the bandwidth tunable filter is allotted with a new reference numeral 1100. The bandwidth tunable filter 1100 also configures the so-called filter bank, and a circuit configuration thereof is as represented in FIG. 1A. That is, it is configured in such a way that a switch 1, a switch 2, a switch 3 and a switch 4, which are changing-over switches, are interposed, in the order named, in four filters which are two low pass filters, a filter 1 and a filter 4, and two high pass filters, a filter 2 and a filter 3, and that a series-connected condition of the filters is switched by the four switches.

Characteristics of the filter 1 and the filter 4, which are the low pass filters, and the filter 2 and the filter 3, which are the high pass filters, being as shown in FIG. 11B, when the four switches are switched as indicated in the table of FIG. 11C, characteristics indicated by band 1 to band 4 in the same table can be obtained as shown in FIG. 11B.

Although an illustration is omitted, a switching of the switch 1, the switch 2, the switch 3 and the switch 4 is carried out by supplying a control signal, approximately the same as the reception band control signal CTL8, to control signal input ends of these switches from the reception band adjustment function section 821 in the system controller 820 of FIG. 8.

Figure 12:
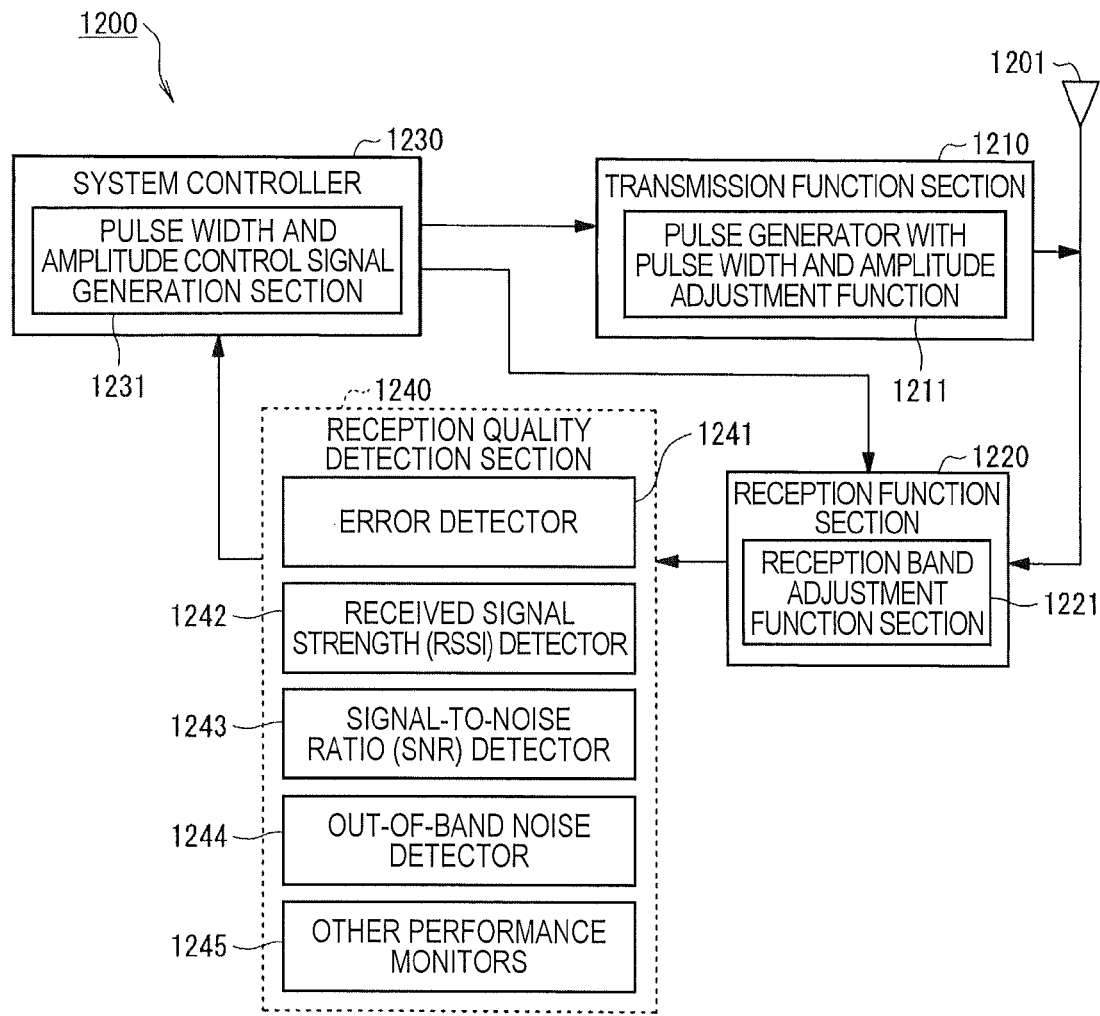
FIG. 12 is a block diagram representing another embodiment of the communication device according to the embodiments.

FIG. 12 is a block diagram showing still another embodiment. A communication device 1200 of FIG. 12 is configured including a transmission function section 1210, approximately the same as the transmission function section described with reference to FIG. 7, a reception function section 1220, approximately the same as the reception function section described with reference to FIG. 8, a system controller 1230, which centrally controls a whole system of the communication device 1200, including a transmission and a reception, and a reception quality detection section 1240 which detects a reception quality relating to a received signal.

The transmission function section 1210 having the heretofore described kind of pulse generator 1211 capable of adjusting the pulse width and amplitude, a pulse having its width and amplitude adjusted in accordance with control signals from a pulse width and amplitude control signal generation section 1231 of the system controller 1230 is modulated in such a way as to bear a baseband, and transmitted from an antenna 1201.

Meanwhile, a reception band of a signal received by the antenna 1201 is appropriately adjusted by a reception band adjustment function section 1221 of the reception function section 1220.

In this embodiment, in particular, a reception quality of the signal received by the reception function section 1220 is detected by the reception quality detection section 1240. The reception quality detection section 1240 is configured including one of an error (BER) detector 1241, a received signal strength (RSSI) detector 1242, a signal-to-noise ratio (SNR) detector 1243, an out-of-band noise detector 1244, or other performance monitors 1245, or a plurality of them.

In accordance with one of BER, SNR, RSSI, each of which serves as a value of the reception quality detected by the reception quality detector 1240, or an out-of-band noise, the pulse width and amplitude control signal generation section 1231 of the system controller 1230 generates the pulse width control signal which adjusts the pulse width of the modulated pulse signal.

In the pulse generator 1211 in the transmission function section 1210 supplied with the pulse width control signal generated in this way, as a frequency band occupied by the modulated pulse signal is adjusted by the unit duration time of the modulated pulse signal being adjusted in accordance with the pulse width control signal, it is possible, in accordance with the reception quality, to effectively suppress interference with a band used by another communication.

Also, the reception band is adjusted in the reception band adjustment function section 1221 of the reception function section 1220, by means of the amplitude control signal emitted from the pulse width and amplitude control signal generation section 1231 of the system controller 1230.

In this case, as the band of the received signal is adjusted in such a way as to correspond to an adjustment value of the pulse width of the modulated pulse signal, set in the transmission function section 1210, both the pulse width and the received signal band are optimized in such a way that an exerting of interference on, or a suffering of interference from, another communication device in the transmission and reception is suppressed to the minimum.

Figure 13:
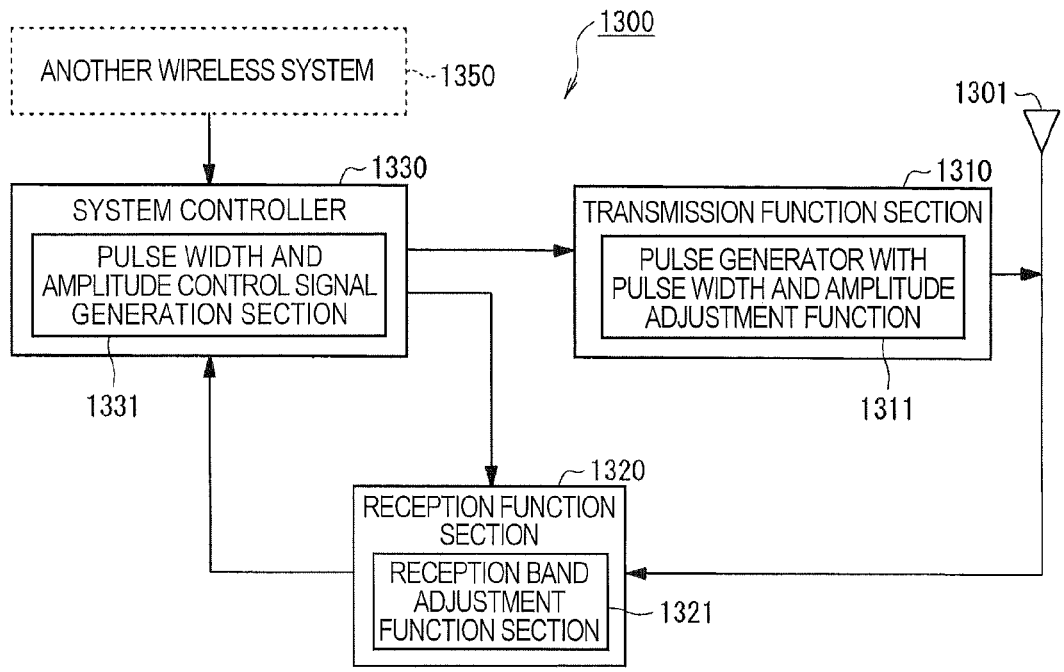
FIG. 13 is a block diagram representing still another embodiment of the communication device according to the embodiments.

FIG. 13 is a block diagram representing still another embodiment. A communication device 1300 of FIG. 13 is configured including a transmission function section 1310, approximately the same as the transmission function section described with reference to FIG. 7, a reception function section 1320, approximately the same as the reception function section described with reference to FIG. 8, and a system controller 1330 which centrally controls a whole system of the communication device 1300, including a transmission and a reception.

The transmission function section 1310 having the heretofore described kind of pulse generator 1311 capable of adjusting the pulse width and amplitude, a pulse having its width and amplitude adjusted in accordance with control signals from a pulse width and amplitude control signal generation section 1331 of the system controller 1330 is modulated in such a way as to bear a baseband, and transmitted from an antenna 1301.

Meanwhile, a reception band of a signal received by the antenna 1301 is appropriately adjusted by a reception band adjustment function section 1321 of the reception function section 1320.

In this embodiment, in particular, the pulse width and amplitude control signal generation section 1331 of the system controller 1330 is configured in such a way as to receive a signal emitted from another external wireless communication device (a wireless system) 1350 and, in accordance with information the received signal bears, generate the pulse width control signal which adjusts the pulse width of the modulated pulse signal.

Consequently, when the signal emitted from the other external wireless communication device (wireless system) 1350 is received, the pulse width and amplitude control signal generation section 1331, in accordance with the information the signal bears, emits the pulse width control signal which adjusts the pulse width of the modulated pulse signal.

In the transmission function section 1310 supplied with the emitted pulse width control signal, as a frequency band occupied by the modulated pulse signal is adjusted by adjusting the unit duration time of the modulated pulse signal in the pulse generator 1311 thereof, it is possible to suppress interference with a band used for another communication (for example, communication by the other external wireless communication device (wireless system) 1350).

Also, the reception band is adjusted in the reception band adjustment function section 1321 of the reception function section 1320, by means of the amplitude control signal emitted from the pulse width and amplitude control signal generation section 1331 of the system controller 1330.

In this case, as the band of the received signal is adjusted in such a way as to correspond to an adjustment value of the pulse width of the modulated pulse signal, set in the transmission function section 1310, both the pulse width and the received signal band are optimized in such a way that an exerting of interference on, or a suffering of interference from, another communication device in the transmission and reception is suppressed to the minimum.

Figure 14:
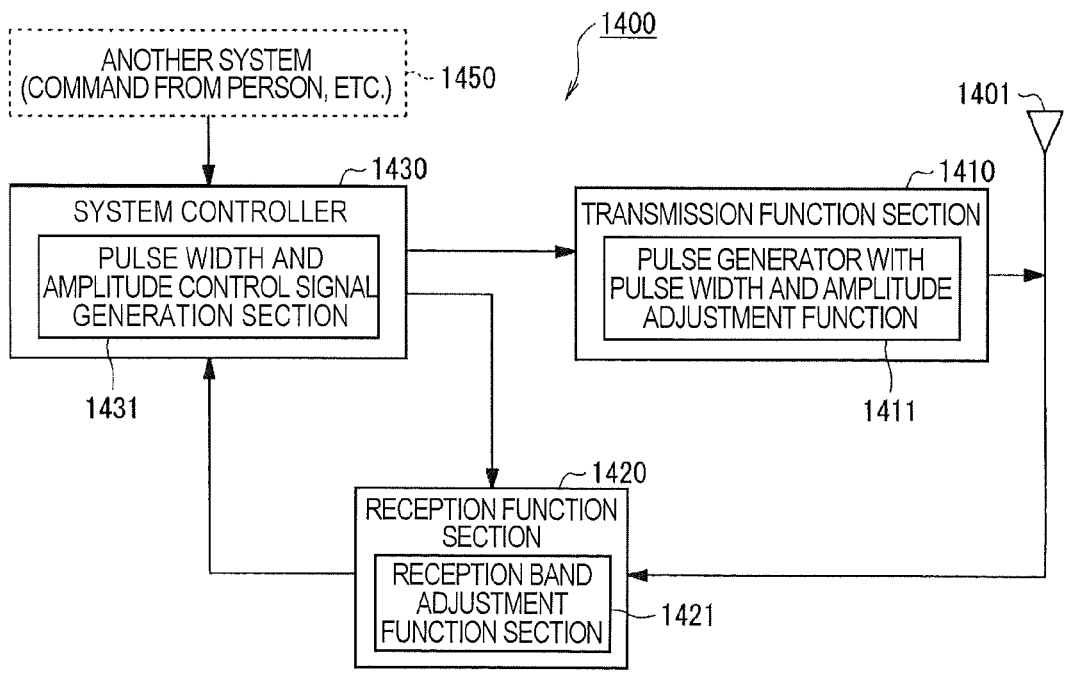
FIG. 14 is a block diagram representing still another embodiment of the communication device according to the embodiments.

FIG. 14 is a block diagram representing still another embodiment. A communication device 1400 of FIG. 14 is configured including a transmission function section 1410, approximately the same as the transmission function section described with reference to FIG. 7, a reception function section 1420, approximately the same as the reception function section described with reference to FIG. 8, and a system controller 1430 which centrally controls a whole system of the communication device 1400, including a transmission and a reception.

The transmission function section 1410 having the heretofore described kind of pulse generator 1411 capable of adjusting the pulse width and amplitude, a pulse having its width and amplitude adjusted in accordance with control signals from a pulse width and amplitude control signal generation section 1431 of the system controller 1430 is modulated in such a way as to bear a baseband, and transmitted from an antenna 1401.

Meanwhile, a reception band of a signal received by the antenna 1401 is appropriately adjusted by a reception band adjustment function section 1421 of the reception function section 1420.

In this embodiment, in particular, the pulse width and amplitude control signal generation section 1431 of the system controller 1430 is configured in such a way as to generate the pulse width control signal which adjusts the pulse width of the modulated pulse signal, in accordance with an action from an external system 1450, that is, an external operation by a user.

Consequently, the pulse width and amplitude control signal generation section 1431, in accordance with the external operation by the user, emits the pulse width control signal which adjusts the pulse width of the modulated pulse signal.

In the transmission function section 1410 supplied with the emitted pulse width control signal, as a frequency band occupied by the modulated pulse signal is adjusted by adjusting the unit duration time of the modulated pulse signal in the pulse generator 1411 thereof, it is possible for the user to consciously suppress interference with a band used by another communication.

Also, the reception band is adjusted in the reception band adjustment function section 1421 of the reception function section 1420, by means of the amplitude control signal emitted from the pulse width and amplitude control signal generation section 1431 of the system controller 1430.

In this case, as the band of the received signal is adjusted in such a way as to correspond to an adjustment value of the pulse width of the modulated pulse signal, set in the transmission function section 1410, both the pulse width and the received signal band are optimized in such a way that an exerting of interference on, or a suffering of interference from, another communication device in the transmission and reception is suppressed to the minimum.

Figure 15:
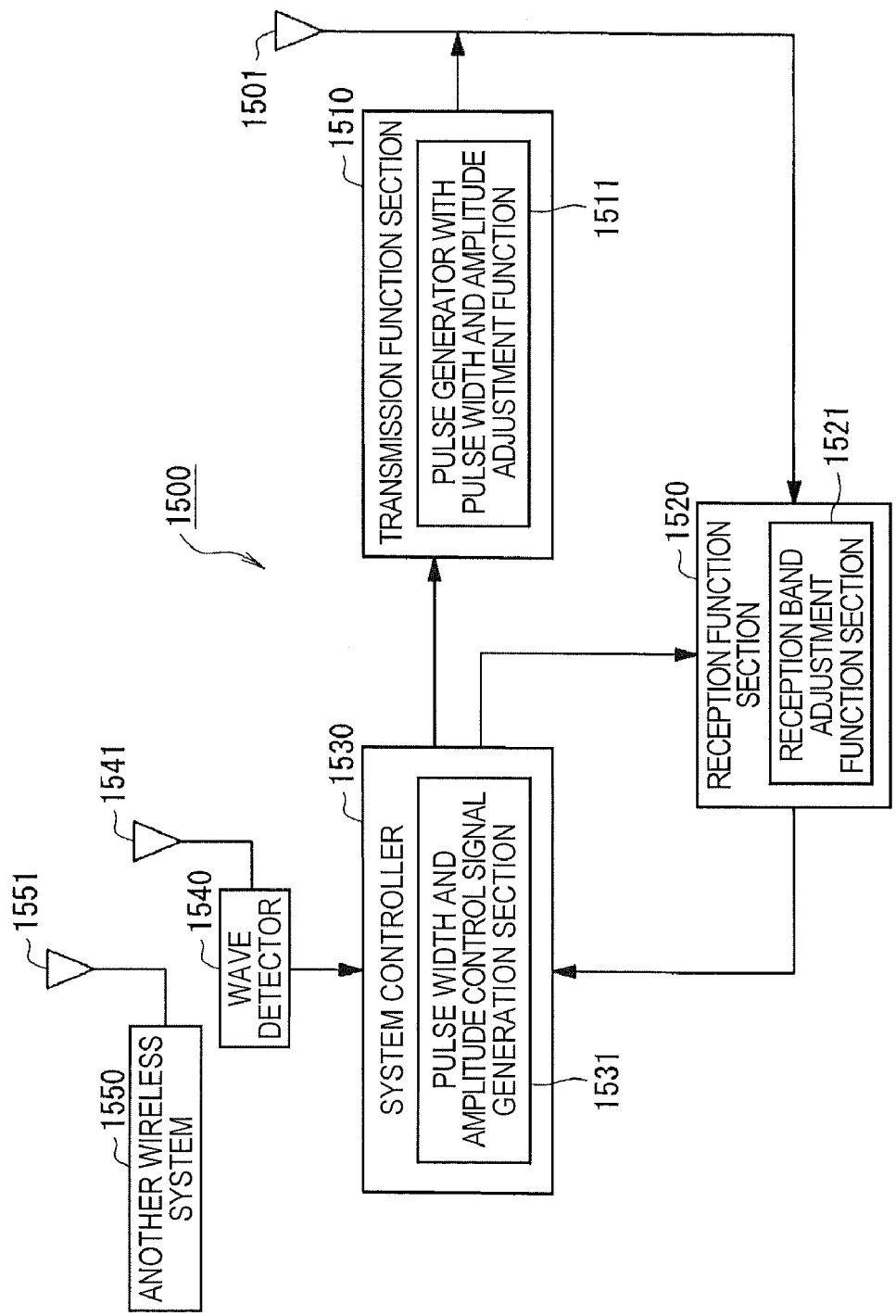
FIG. 15 is a block diagram representing still another embodiment of the communication device according to the embodiments.

FIG. 15 is a block diagram representing still another embodiment. A communication device 1500 of FIG. 15 is configured including a transmission function section 1510, approximately the same as the transmission function section described with reference to FIG. 7, a reception function section 1520, approximately the same as the reception function section described with reference to FIG. 8, and a system controller 1530 which centrally controls a whole system of the communication device 1500, including a transmission and a reception.

The transmission function section 1510 having the heretofore described kind of pulse generator 1511 capable of adjusting the pulse width and amplitude, a pulse having its width and amplitude adjusted in accordance with control signals from a pulse width and amplitude control signal generation section 1531 of the system controller 1530 is modulated in such a way as to bear a baseband, and transmitted from an antenna 1501.

Meanwhile, a reception band of a signal received by the antenna 1501 is appropriately adjusted by a reception band adjustment function section 1521 of the reception function section 1520.

In this embodiment, in particular, the pulse width and amplitude control signal generation section 1531 of the system controller 1530 is configured in such a way as to receive a signal, transmitted from an antenna 1551 by another external wireless communication device (wireless system) 1550, which indicates an operating condition, such as an operation or a nonoperation, of the other external wireless communication device 1550, with a wave detector 1540 having an antenna 1541 and, in accordance with an output of a detection by means of the received signal which indicates the operating condition such as the operation or nonoperation, generate the pulse width control signal which adjusts the pulse width of the modulated pulse signal.

That is, in this embodiment, an operating condition detector, which detects an operating condition, such as an operation or a nonoperation, of an external communication device, being configured of the wave detector 1540 and an appropriate function section of the system controller 1530, the pulse width control signal is generated in accordance with an output of a detection by the operating condition detector, with a result that an output pulse width in the pulse generator 1511 of the transmission function section 1510 is controlled in accordance with the operating condition such as the operation or nonoperation of the external communication device.

Consequently, it is possible to effectively suppress interference with a band used only for a period which essentially affects communication by the external communication device.

Also, the reception band is adjusted in the reception band adjustment function section 1521 of the reception function section 1520, by means of the amplitude control signal emitted from the pulse width and amplitude control signal generation section 1531 of the system controller 1530.

In this case, as the band of the received signal is adjusted in such a way as to correspond to an adjustment value of the pulse width of the modulated pulse signal, set in the transmission function section 1510, both the pulse width and the received signal band are optimized in such a way that an exerting of interference on, or a suffering of interference from, another communication device in the transmission and reception is suppressed to the minimum.

Figure 16:
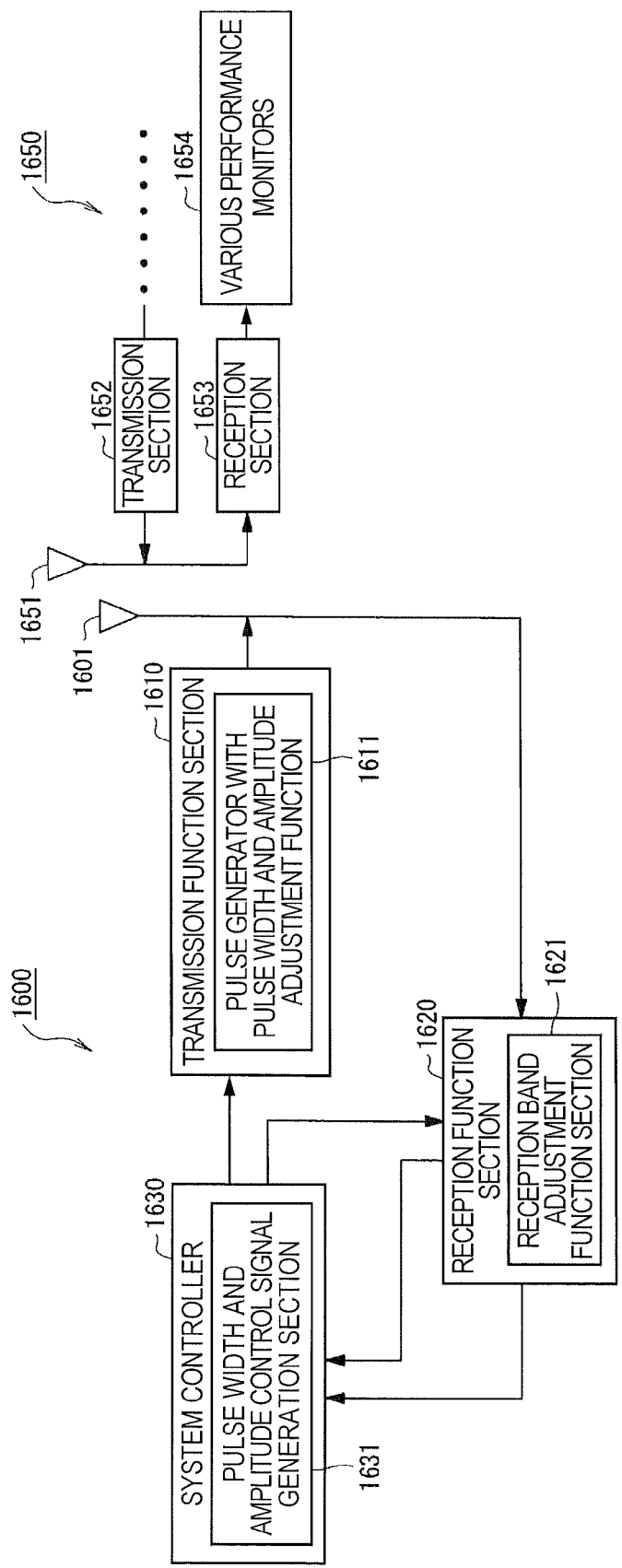
FIG. 16 is a block diagram representing still another embodiment of the communication device according to the embodiments.

FIG. 16 is a block diagram representing still another embodiment. A communication device 1600 of FIG. 16 is configured including a transmission function section 1610, approximately the same as the transmission function section described with reference to FIG. 7, a reception function section 1620, approximately the same as the reception function section described with reference to FIG. 8, and a system controller 1630 which centrally controls a whole system of the communication device 1600, including a transmission and a reception.

The transmission function section 1610 having the heretofore described kind of pulse generator 1611 capable of adjusting the pulse width and amplitude, a pulse having its width and amplitude adjusted in accordance with control signals from a pulse width and amplitude control signal generation section 1631 of the system controller 1630 is modulated in such a way as to bear a baseband, and transmitted from an antenna 1601.

Meanwhile, a reception band of a signal received by the antenna 1601 is appropriately adjusted by a reception band adjustment function section 1621 of the reception function section 1620.

In this embodiment, in particular, the pulse width and amplitude control signal generation section 1631 of the system controller 1630 operates in such a way as to respond to a signal transmitted from another external wireless communication device (a wireless system) 1650.

In this case, it is supposed that the other external wireless communication device (wireless system) 1650 includes a transmission section 1652 and a reception section 1653, and includes various performance monitors 1654 which monitor various characteristics relating to the reception quality from the signal received by the reception section 1653 through an antenna 1651.

The other external wireless communication device (wireless system) 1650, when it is a current correspondent, selects a pulse width compatible with current communication, in accordance with a current reception quality detected through the various performance monitors 1654, and transmits a pulse width adjustment request signal, which requests the correspondent to match a pulse width used for the communication with the selected pulse width, from the transmission section 1652 through the antenna 1651.

On the pulse width adjustment request signal emitted from the other external wireless communication device (wireless system) 1650 in the way heretofore described being received by the reception function section 1620 and forwarded to the system controller 1630, the pulse width and amplitude control signal generation section 1631 of the system controller 1630, in accordance with information (a request) the pulse width adjustment request signal bears, emits the pulse width control signal which adjusts the pulse width of the modulated pulse signal and, as a frequency band occupied by the modulated pulse signal is adjusted by adjusting the unit duration time of the modulated pulse signal in the pulse generator 1611 which operates in accordance with the emitted pulse width control signal, it is possible to carry out the communication with the external wireless communication device, while maintaining an adaptively good condition, in a form of responding to the request made by the wireless communication device.

Also, the reception band is adjusted in the reception band adjustment function section 1621 of the reception function section 1620, by means of the amplitude control signal emitted from the pulse width and amplitude control signal generation section 1631 of the system controller 1630.

In this case, as the band of the received signal is adjusted in such a way as to correspond to an adjustment value of the pulse width of the modulated pulse signal, set in the transmission function section 1610, both the pulse width and the received signal band are optimized in such a way that an exerting of interference on, or a suffering of interference from, another communication device in the transmission and reception is suppressed to the minimum.

Figure 17:
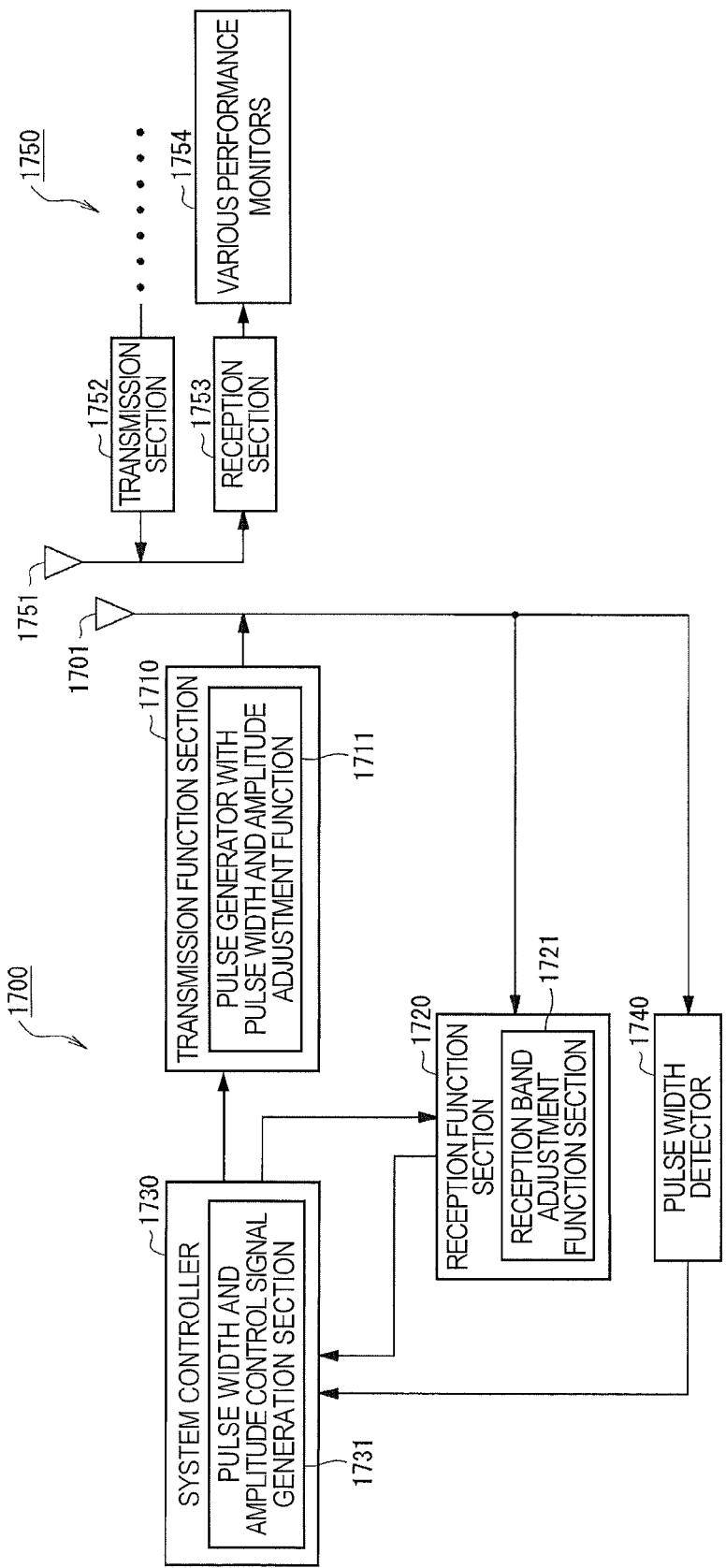
FIG. 17 is a block diagram representing still another embodiment of the communication device according to the embodiments.

FIG. 17 is a block diagram representing still another embodiment. A communication device 1700 of FIG. 17 is configured including a transmission function section 1710, approximately the same as the transmission function section described with reference to FIG. 7, a reception function section 1720, approximately the same as the reception function section described with reference to FIG. 8, and a system controller 1730 which centrally controls a whole system of the communication device 1700, including a transmission and a reception.

The transmission function section 1710 having the heretofore described kind of pulse generator 1711 capable of adjusting the pulse width and amplitude, a pulse having its width and amplitude adjusted in accordance with control signals from a pulse width and amplitude control signal generation section 1731 of the system controller 1730 is modulated in such a way as to bear a baseband, and transmitted from an antenna 1701.

Meanwhile, a reception band of a signal received by the antenna 1601 is appropriately adjusted by a reception band adjustment function section 1721 of the reception function section 1720.

In this embodiment, in particular, the pulse width and amplitude control signal generation section 1731 of the system controller 1730 operates in such a way as to respond to a signal transmitted from another external wireless communication device (a wireless system) 1750.

In this case, it is supposed that the other external wireless communication device (wireless system) 1750 includes a transmission section 1752 and a reception section 1753, and includes various performance monitors 1754 which monitor various characteristics relating to the reception quality from the signal received by the reception section 1753 through an antenna 1751.

The other external wireless communication device (wireless system) 1750, when it is a current correspondent, selects a pulse width compatible with current communication, in accordance with a current reception quality detected through the various performance monitors 1754, adjusts a pulse width used for the communication to the selected pulse width, and transmits it from the transmission section 1752 through the antenna 1751.

When, as well as the signal, having its pulse width adjusted in the way heretofore described, which has been emitted from the other external wireless communication device (wireless system) 1750 being received by the reception function section 1720, the pulse width of the signal is detected by a pulse width detector 1740, and a detection value thereof is forwarded to the system controller 1730, the pulse width and amplitude control signal generation section 1731 of the system controller 1730, in accordance with the pulse width, emits the pulse width control signal which adjusts the pulse width of the modulated pulse signal, and the pulse width which is the unit duration time of the modulated pulse signal is matched with the detected pulse width in the pulse generator 1711, optimally adjusting the frequency band occupied by the modulated pulse signal.

Consequently, it is possible to carry out the communication with the external wireless communication device, while maintaining an adaptively good condition, in a form of responding to a request made by the wireless communication device.

Also, the reception band is adjusted in the reception band adjustment function section 1721 of the reception function section 1720, by means of the amplitude control signal emitted from the pulse width and amplitude control signal generation section 1731 of the system controller 1730.

In this case, as the band of the received signal is adjusted in such a way as to correspond to an adjustment value of the pulse width of the modulated pulse signal, set in the transmission function section, both the pulse width and the received signal band are optimized in such a way that an exerting of interference on, or a suffering of interference from, another communication device in the transmission and reception is suppressed to the minimum.

Figure 18:
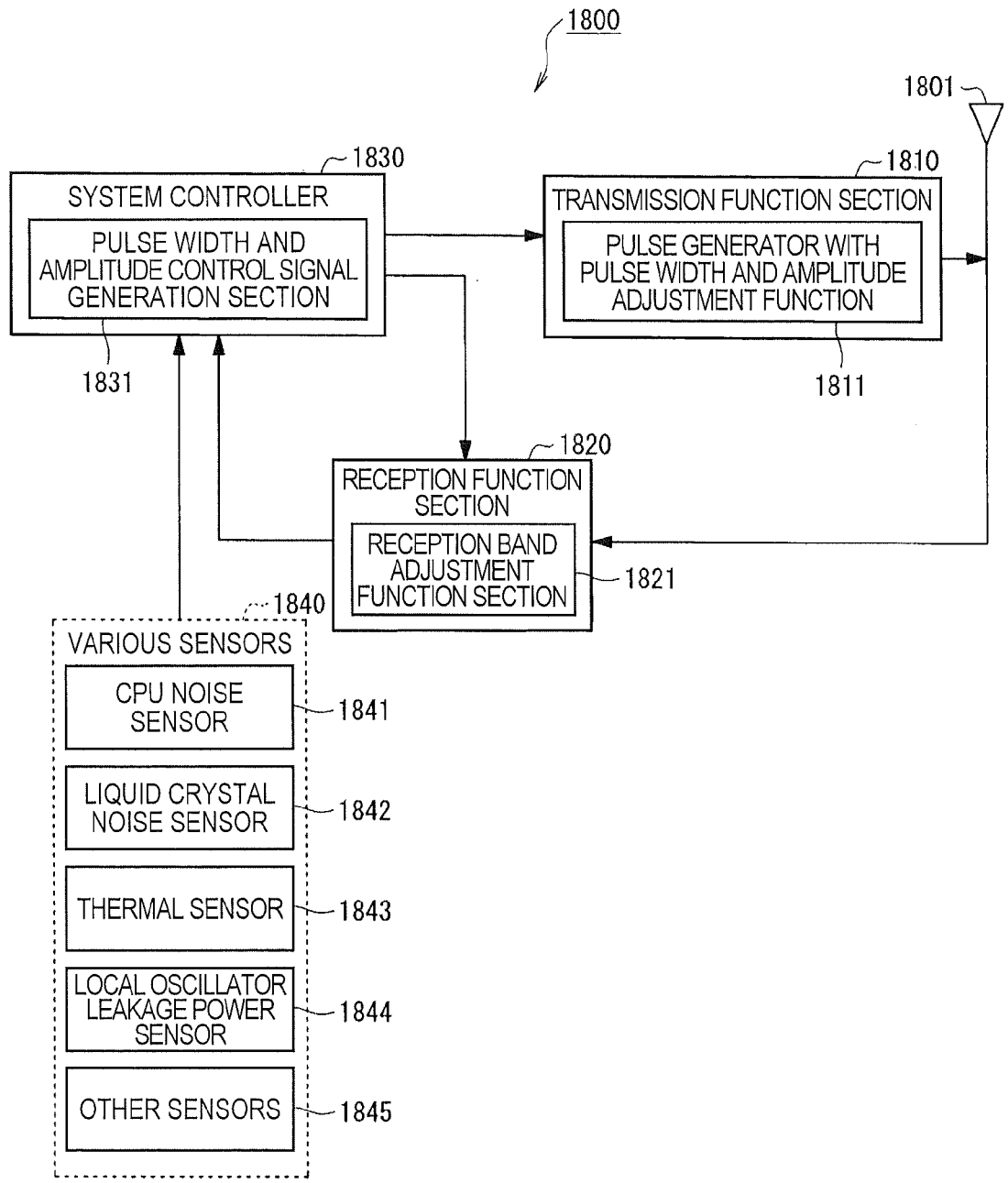
FIG. 18 is a block diagram representing still another embodiment of the communication device according to the embodiments.

FIG. 18 is a block diagram representing still another embodiment belonging to the communication device as the other embodiment. A communication device 1800 of FIG. 18 is configured including a transmission function section 1810, approximately the same as the transmission function section described with reference to FIG. 7, a reception function section 1820, approximately the same as the reception function section described with reference to FIG. 8, a system controller 1830 which centrally controls a whole system of the communication device 1800, including a transmission and a reception, and various sensors 1840 which detect an amount of physical phenomenon conditions relating to an external electronic device.

The transmission function section 1810 having the heretofore described kind of pulse generator 1811 capable of adjusting the pulse width and amplitude, a pulse having its width and amplitude adjusted in accordance with control signals from a pulse width and amplitude control signal generation section 1831 of the system controller 1830 is modulated in such a way as to bear a baseband, and transmitted from an antenna 1801.

Meanwhile, a reception band of a signal received by the antenna 1801 is appropriately adjusted by a reception band adjustment function section 1821 of the reception function section 1820.

In this embodiment, in particular, the amount of physical phenomenon conditions relating to the external electronic device is detected by the various sensors 1840. The various sensors 1840 are configured including one of a CPU noise sensor 1841, a liquid crystal noise sensor 1842, a thermal sensor 1843, a local oscillator leakage power sensor 1844, or other sensors 1845, or a plurality of them.

In accordance with an output of a detection of the amount of physical phenomenon conditions, detected by the various sensors 1840, which has a high correlation with an operating condition of the external electronic device, the pulse width and amplitude control signal generation section 1831 of the system controller 1830 generates the pulse width control signal which adjusts the pulse width of the modulated pulse signal. Herein, the amount of physical phenomenon conditions having a high correlation with the operating condition of the external electronic device, being an amount of physical conditions of the external electronic device, refers to an output, such as noise, heat or vibration, which occurs along with an operation of the external electronic device.

In the pulse generator 1811 in the transmission function section 1810 supplied with the pulse width control signal generated in this way, as a frequency band occupied by the modulated pulse signal is adjusted by the unit duration time of the modulated pulse signal being adjusted in accordance with the pulse width control signal, it is possible, in accordance with a reception quality, to effectively suppress an interference with a band used by another communication.

FIG. 22 shows a relationship between a noise, which occurs from a device in a casing identical to that of the communication device 1800, and a pulse width. As shown in the figure, in a case in which pulse communication by the communication device 1800 has a higher priority than communication by another wireless device, in the event that the noise from the CPU or the liquid crystal is higher than a predetermined reference value, the pulse width of the communication device 1800 is narrowed in order to heighten a quality of the pulse communication. Subsequently, in the event that the noise becomes lower than the predetermined reference value, the pulse width is made an optimum one for the system of the communication device 1800. On the other hand, in a case in which the communication by the other wireless device has a higher priority than the pulse communication by the communication device 1800, in the event that the noise from the CPU or the liquid crystal is higher than the predetermined reference value, for example, as in voice communication of a mobile phone, when a noise indicating that the other wireless device is in the process of communication is detected, the pulse width of the communication device 1800 is widened in order to avoid obstructing the communication. Subsequently, in the event that the noise becomes lower than the predetermined reference value, the pulse width is made the optimum one for the system of the communication device 1800.

Also, the reception band is adjusted in the reception band adjustment function section 1821 of the reception function section 1820, by means of the amplitude control signal emitted from the pulse width and amplitude control signal generation section 1831 of the system controller 1830.

In this case, as the band of the received signal in the reception function section 1820 is adjusted in such a way as to correspond to an adjustment value of the pulse width of the modulated pulse signal, set in the transmission function section 1810, both the pulse width and the received signal band are optimized in such a way that an exerting of interference on, or a suffering of interference from, another communication device in the transmission and reception is suppressed to the minimum.

Figure 19:
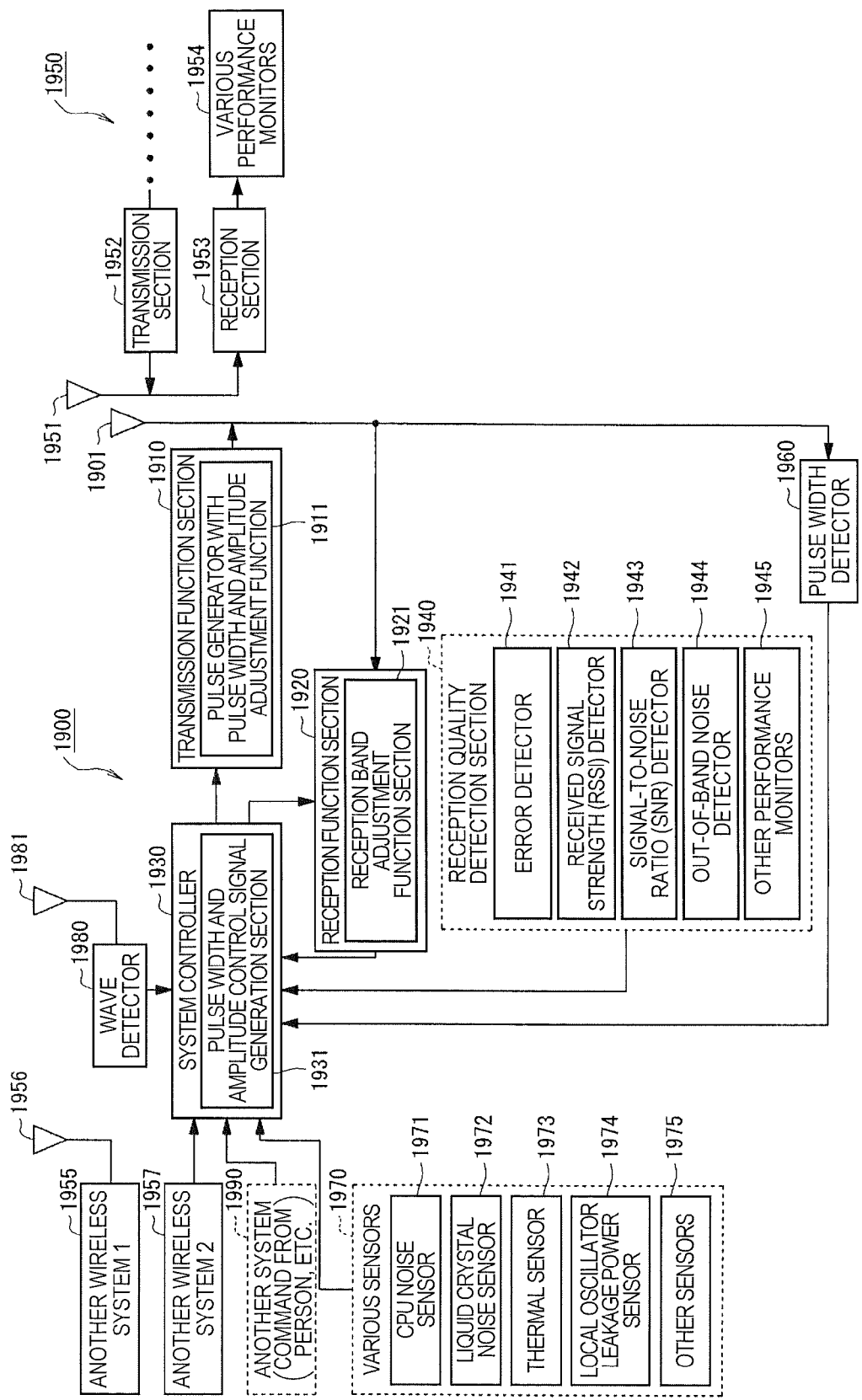
FIG. 19 is a block diagram representing still another embodiment of the communication device according to the embodiments.

FIG. 19 is a block diagram representing still another embodiment. A communication device 1900 of FIG. 19 is configured including a transmission function section 1910, approximately the same as the transmission function section described with reference to FIG. 7, a reception function section 1920, approximately the same as the reception function section described with reference to FIG. 8, and a system controller 1930 which centrally controls a whole system of the communication device 1900, including a transmission and a reception.

The transmission function section 1910 having the heretofore described kind of pulse generator 1911 capable of adjusting the pulse width and amplitude, a pulse having its width and amplitude adjusted in accordance with control signals from a pulse width and amplitude control signal generation section 1931 of the system controller 1930 is modulated in such a way as to bear a baseband, and transmitted from an antenna 1901.

In this embodiment, in particular, a reception quality of a signal received by the reception function section 1920 is detected by a reception quality detection section 1940. The reception quality detection section 1940 is configured including one of an error (BER) detector 1941, a received signal strength (RSSI) detector 1942, a signal-to-noise ratio (SNR) detector 1943, an out-of-band noise detector 1944, or other performance monitors 1945, or a plurality of them.

Also, the pulse width and amplitude control signal generation section 1931 of the system controller 1930 is configured in such a way as to receive a signal emitted from an external electronic device 1957 described as another wireless system 2 in the figure and, in accordance with information the received signal bears, generate the pulse width control signal which adjusts the pulse width of the modulated pulse signal.

Further still, the pulse width and amplitude control signal generation section 1931 of the system controller 1930 is configured in such a way as to receive a signal, transmitted from an antenna 1956 by another external wireless communication device (a wireless system) 1955 described as another wireless system 1 in the figure, which indicates an operating condition, such as an operation or a nonoperation, of the other external wireless communication device 1955, with a wave detector 1980 having an antenna 1981 and, in accordance with an output of a detection by means of the received signal which indicates the operating condition such as the operation or nonoperation, generate the pulse width control signal which adjusts the pulse width of the modulated pulse signal.

That is, in this embodiment, an operating condition detector, which detects the operating condition such as the operation or nonoperation of the other external wireless communication device 1955, being configured of the wave detector 1980 and an appropriate function section of the system controller 1930, the pulse width control signal is generated in accordance with an output of a detection by the operating condition detector, with a result that an output pulse width in the pulse generator 1911 of the transmission function section 1910 is controlled in accordance with the operating condition such as the operation or nonoperation of the other external wireless communication device 1955.

Also, the pulse width and amplitude control signal generation section 1931 of the system controller 1930 operates in such a way as to respond to a signal transmitted from the other external wireless communication device (wireless system) 1950.

The other external wireless communication device (wireless system) 1950 includes a transmission section 1952 and a reception section 1953, and includes various performance monitors 1954 which monitor various characteristics relating to the reception quality from the signal received by the reception section 1953 through an antenna 1951.

The other external wireless communication device (wireless system) 1950, when it is a current correspondent, selects a pulse width compatible with current communication, in accordance with a current reception quality detected through the various performance monitors 1954, and transmits a pulse width adjustment request signal, which requests the correspondent to match a pulse width used for the communication with the selected pulse width, from the transmission section 1952 through the antenna 1951.

On the pulse width adjustment request signal emitted from the other external wireless communication device (wireless system) 1950 in the way heretofore described being received by the reception function section 1920 and forwarded to the system controller 1930, the pulse width and amplitude control signal generation section 1931 of the system controller 1930, in accordance with information (a request) the pulse width adjustment request signal bears, emits the pulse width control signal which adjusts the pulse width of the modulated pulse signal and, as a frequency band occupied by the modulated pulse signal is adjusted by adjusting the unit duration time of the modulated pulse signal in the pulse generator 1911 which operates in accordance with the emitted pulse width control signal, it is possible to carry out the communication with the external electronic device 1957, while maintaining an adaptively good condition, in a form of responding to the request made by the electronic device.

Further still, the other external wireless communication device (wireless system) 1950 can be one configured in such a way as to, when it is a current correspondent, select a pulse width compatible with current communication, in accordance with the current reception quality detected through the various performance monitors 1954, adjust the pulse width used for the communication to the selected pulse width, and transmit the pulse signal from the transmission section 1952 through the antenna 1951.

When, as well as the signal, having its pulse width adjusted in the way heretofore described, which has been emitted from the other external wireless communication device (wireless system) 1950 being received by the reception function section 1920, the pulse width of the signal is detected by a pulse width detector 1960, and a detection value thereof is forwarded to the system controller 1930, the pulse width and amplitude control signal generation section 1931 of the system controller 1930, in accordance with the pulse width, emits the pulse width control signal which adjusts the pulse width of the modulated pulse signal, and the pulse width which is the unit duration time of the modulated pulse signal is matched with the detected pulse width in the pulse generator 1911 which operates in accordance with the emitted pulse width control signal, optimally adjusting the frequency band occupied by the modulated pulse signal.

Consequently, it is possible to carry out the communication with the external wireless communication device, while maintaining an adaptively good condition, in a form of responding to the request made by the external electronic device 1957.

Furthermore, a configuration is such that an output of a detection by the various sensors 1970 which detect an amount of physical phenomenon conditions relating to the external electronic device 1957 is also supplied to the system controller 1930. Herein, the various sensors 1970 are configured including one of a CPU noise sensor 1971, a liquid crystal noise sensor 1972, a thermal sensor 1973, a local oscillator leakage power sensor 1974, or other sensors 1975, or a plurality of them.

In accordance with an output of a detection of the amount of physical phenomenon conditions, detected by the various sensors 1970, which has a high correlation with an operating condition of the external electronic device 1957, the pulse width and amplitude control signal generation section 1931 of the system controller 1930 generates the pulse width control signal which adjusts the pulse width of the modulated pulse signal.

As above, in the communication device 1900 of FIG. 19, the system controller 1930 generates the control signals in the pulse width and amplitude control signal generation section 1931 by placing selective reliance on one or a plurality of the heretofore described various kinds of condition amount input (input data), and supplies them to the pulse generator 1911 of the transmission function section 1910. The pulse generator 1911 thus supplied transmits a signal whose output pulse width has been optimized based on the control signals.

Also, as the band of the received signal in the reception function section 1920 is adjusted in such a way as to correspond to an adjustment value of the pulse width of the modulated pulse signal, set in the transmission function section 1910, both the pulse width and the received signal band are optimized in such a way that an exerting of interference on, or a suffering of interference from, another communication device in the transmission and reception is suppressed to the minimum.

FIGS. 20A and 20B are diagrams illustrating an aspect of the adjustment of the pulse width in the communication device of the embodiments. FIGS. 20A and 20B particularly represent a control aspect in which the communication device, in a case of knowing in advance that another wireless system (a communication device), positioned adjacent to the device itself, carries out a transmission and a reception alternately in regular cycles, automatically carries out the pulse width adjustment in the event of detecting that the wireless system has started the transmission.

FIG. 20A shows that the width of the pulse emitted from the pulse generator of the transmission function section is adjusted by means of the control signals emitted from the pulse width and amplitude control signal generation section of the system controller described above in accordance with the transmission and reception cycles of the adjacent wireless system.

Herein, in the example shown in the figure, by narrowing the width of the pulse output from the device itself, when the adjacent wireless system is in a transmission mode, and widening it when it is in a reception mode, as well as interference with the adjacent wireless system being suppressed as far as possible, it is not necessary to make a communication quality in the device itself lower than it has to be.

FIG. 20B shows that the width of the pulse transmitted from the device itself is widened when it is detected that the adjacent wireless system has started the communication, and the width of the pulse transmitted from the device itself is narrowed in a resting phase of the communication in the adjacent wireless system. The interference is suppressed by widening the width of the pulse and, in the event that the transmission has stopped for a while, it being taken that the communication by the adjacent wireless system has been completed, the width of the pulse is narrowed, and a communication environment on its own side is restored.

Figure 23:
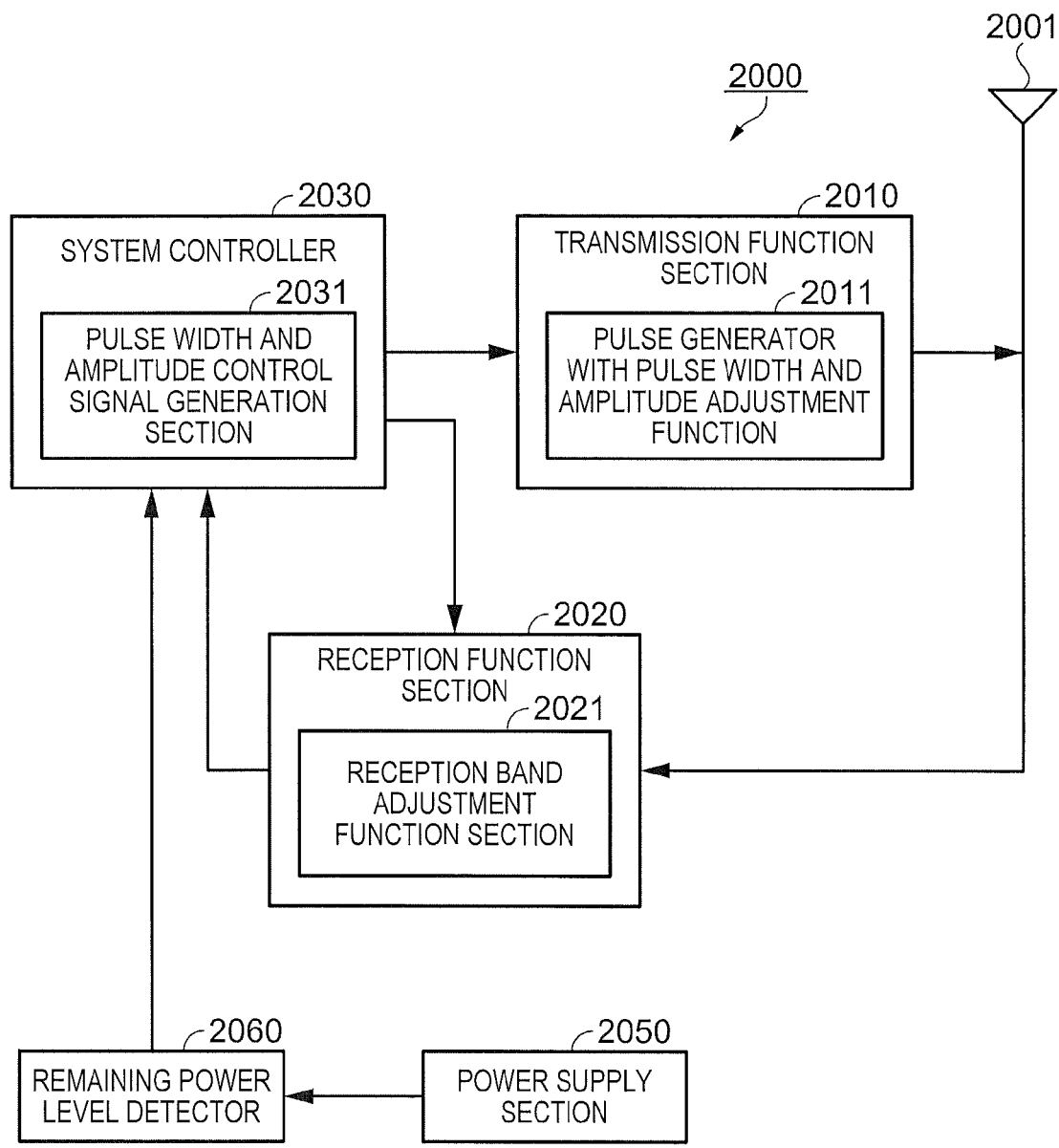
FIG. 23 is a block diagram representing still another embodiment of the communication device according to the embodiments.

FIG. 23 is a block diagram representing still another embodiment. A communication device 2000 of FIG. 23 is configured including a transmission function section 2010, a reception function section 2020, a system controller 2030, a power supply section 2050 and a remaining power level detection section 2060. The transmission function section 2010 has a transmission function, approximately the same as that of the transmission function section 700a described with reference to FIG. 7. The reception function section 2020 has a reception function, approximately the same as that of the reception function section 800a described with reference to FIG. 8. The system controller 2030 centrally controls a whole of the communication device 2000. The power supply section 2050 supplies power to the communication device 2000, and the remaining power level detection section 2060 detects a remaining power level of the power supply section 2050.

Furthermore, the transmission function section 2010 having the heretofore described kind of pulse generator 2011 capable of adjusting the pulse width and amplitude, a pulse having its width and amplitude adjusted in accordance with control signals from the pulse width and amplitude control signal generation section 2031 of the system controller 2030 is modulated in such a way as to bear a baseband, and transmitted from an antenna 2001.

Meanwhile, a reception band of a signal received by the antenna 2001 is appropriately adjusted by a reception band adjustment function section 2021 of the reception function section 2020.

In this embodiment, it is supposed that the power supply section 2050 is a primary battery or a secondary battery. Also, the remaining power level detection section 2060, by measuring a voltage or the like of the primary battery or secondary battery, and comparing it with a voltage in an initial condition, detects a remaining level of the battery, and sends information relating to the detected remaining battery level to the system controller 2030. The pulse width and amplitude control signal generation section 2031 of the system controller 2030, in accordance with the information relating to the remaining battery level, generates the pulse width control signal which adjusts the pulse width and amplitude of the modulated pulse signal.

Figure 24:
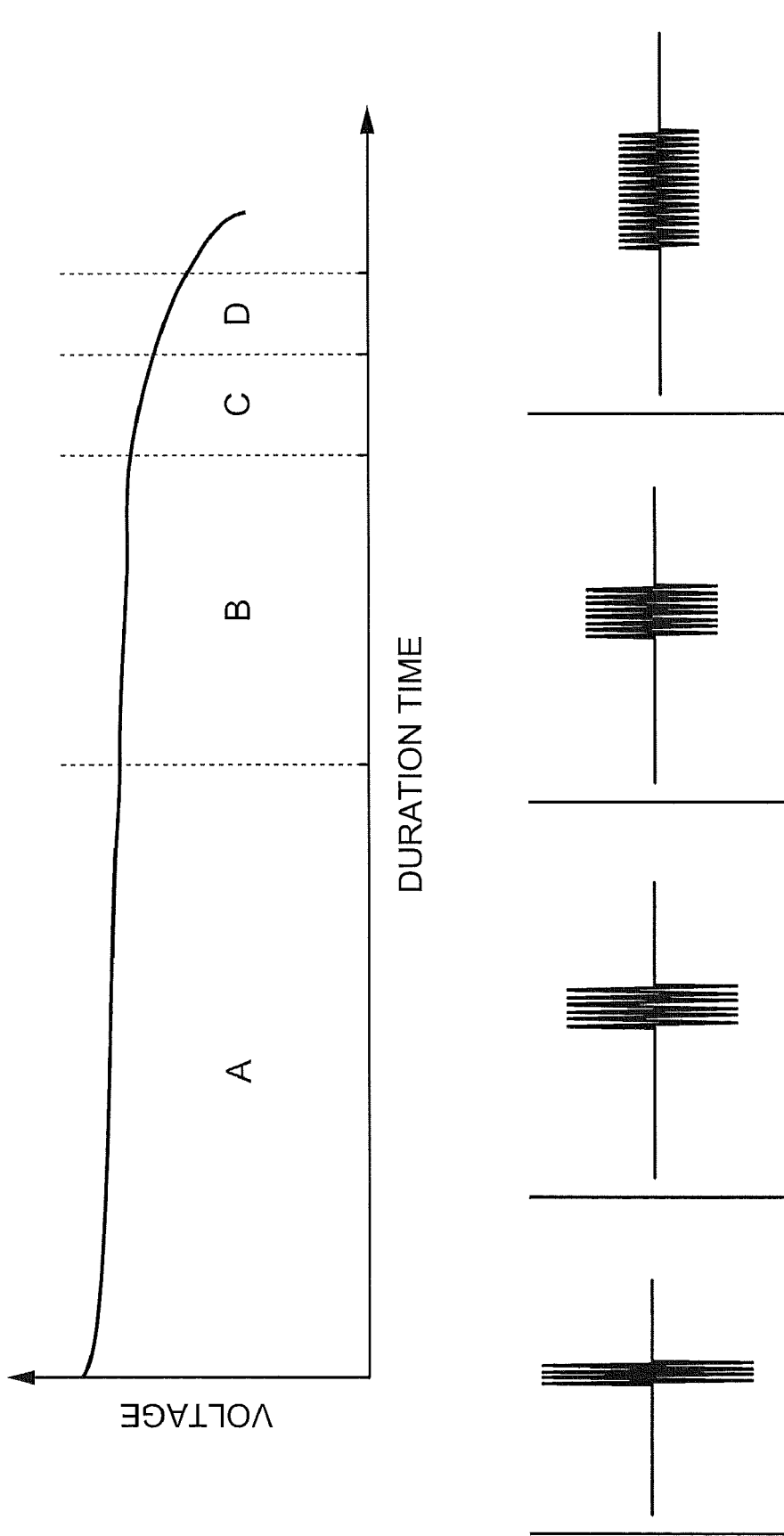
FIG. 24 is a diagram showing one relationship between a voltage transition, involved in use of a battery, and a pulse.
Figure 25:
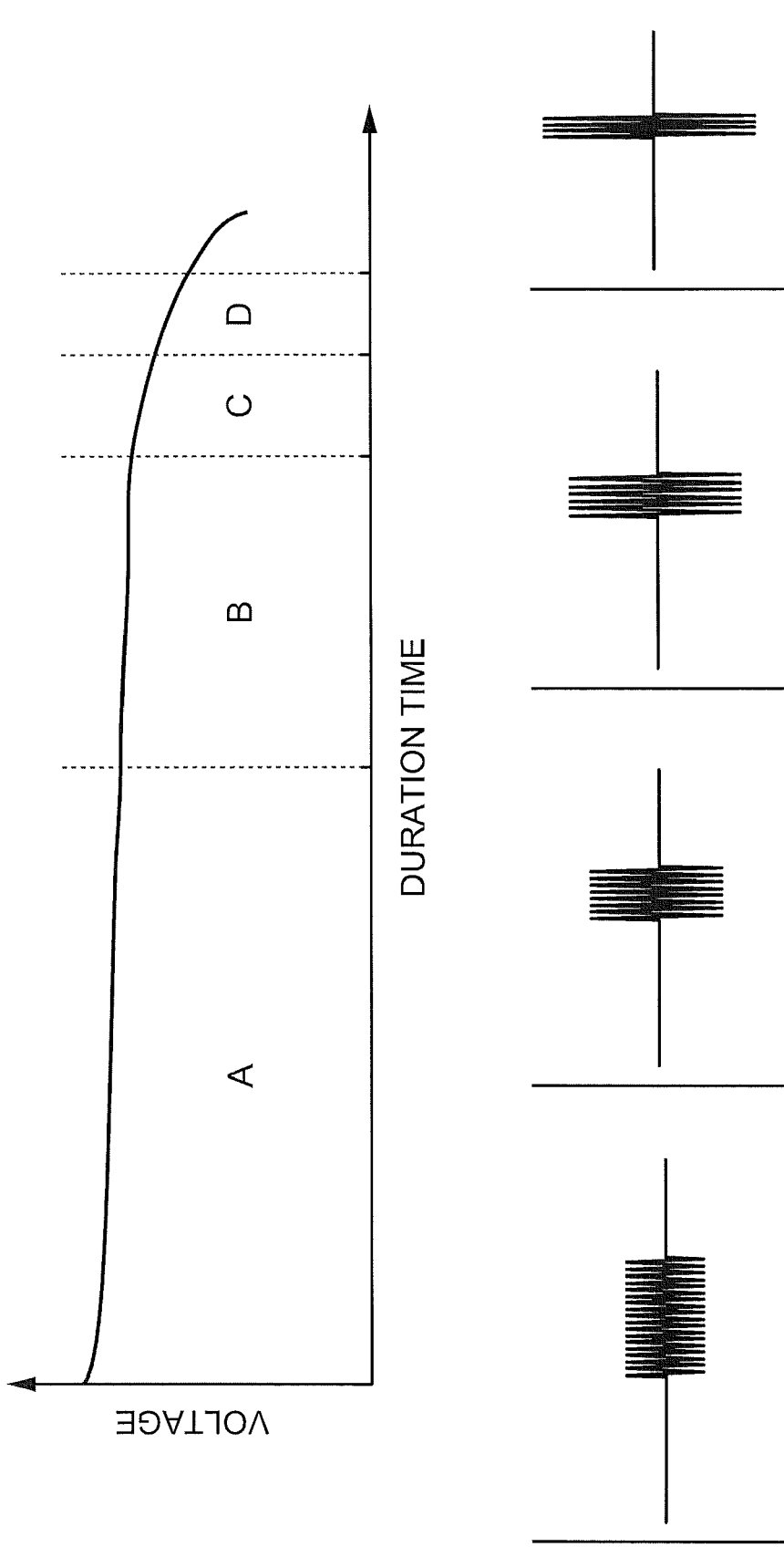
FIG. 25 is a diagram showing another relationship between the voltage transition, involved in the use of the battery, and the pulse.

FIG. 24 is a diagram showing one relationship between a voltage transition along with use of the battery and a pulse indicated by the pulse width control signal. As shown in the figure, as the voltage drops along with the use of the battery, the pulse width and amplitude are adjusted as in A, B, C and D. In this case, as the remaining battery level decreases, in order to avoid obstructing an adjacent communication having a high priority, as well as the pulse width being widened, the amplitude becomes smaller. Also, FIG. 25 is a diagram showing the other relationship between the voltage transition along with the use of the battery and the pulse indicated by the pulse width control signal. As shown in the figure, as the voltage drops along with the use of the battery, the pulse width and amplitude are adjusted as in A, B, C and D. In this case, as the remaining battery level decreases, in order to suppress a power consumption of the communication device 2000, as well as the pulse width being narrowed, the amplitude becomes larger.

Figure 26:
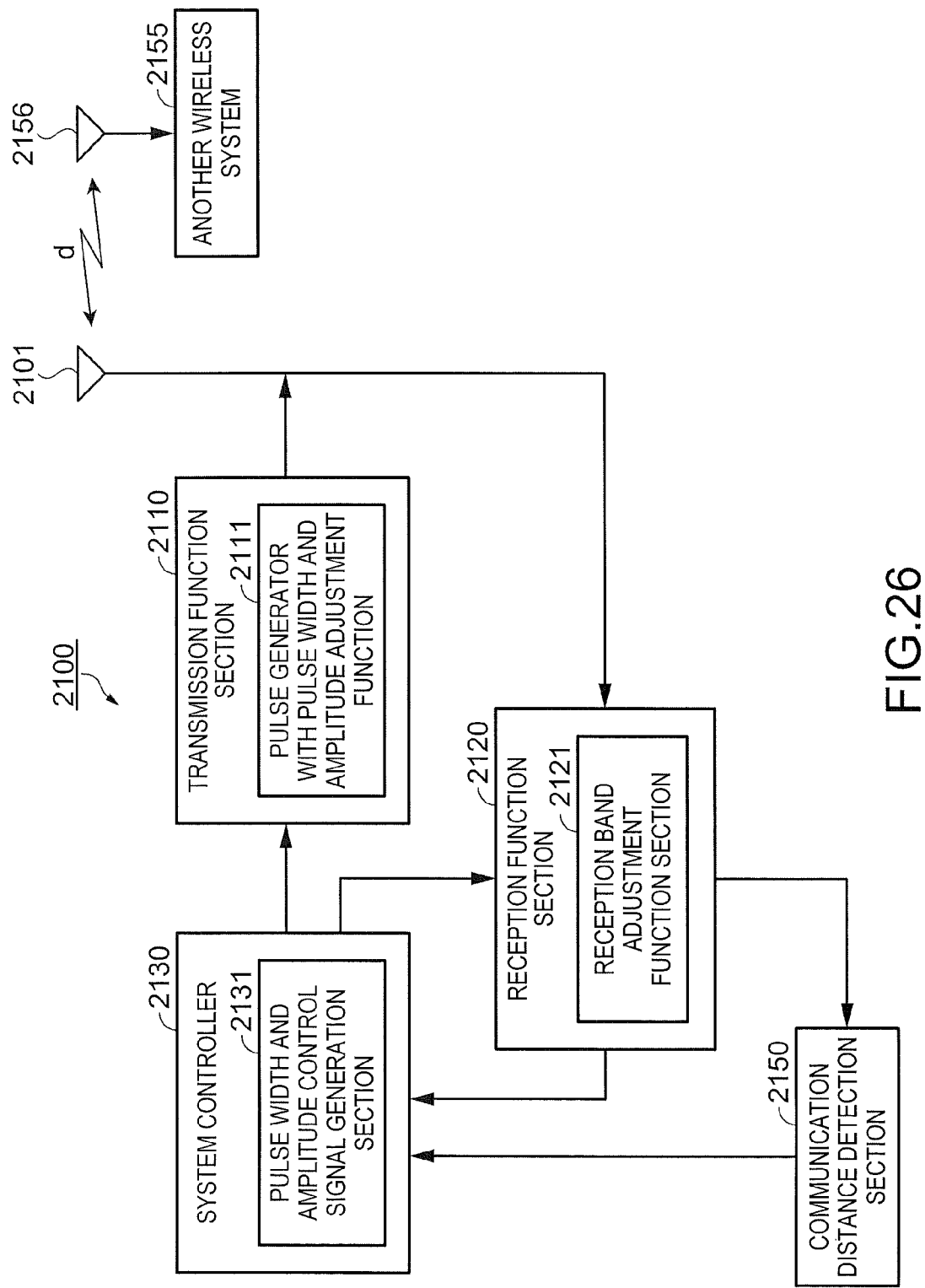
FIG. 26 is a block diagram representing still another embodiment of the communication device according to the embodiments.

FIG. 26 is a block diagram representing still another embodiment. A communication device 2100 of FIG. 26 is configured including a transmission function section 2110, a reception function section 2120, a system controller 2130 and a communication distance detection section 2150. The transmission function section 2110 has a transmission function, approximately the same as that of the transmission function section 700a described with reference to FIG. 7. The reception function section 2120 has a reception function, approximately the same as that of the reception function section 800a described with reference to FIG. 8. The system controller 2130 centrally controls a whole of the communication device 2100. The communication distance detection section 2150 detects a communication distance from a correspondent of the communication device 2100.

Furthermore, the transmission function section 2110 having the heretofore described kind of pulse generator 2111 capable of adjusting the pulse width and amplitude, a pulse having its width and amplitude adjusted in accordance with control signals from the pulse width and amplitude control signal generation section 2131 of the system controller 2130 is modulated in such a way as to bear a baseband, and transmitted from an antenna 2101.

Meanwhile, a reception band of a signal received by the antenna 2101 is appropriately adjusted by a reception band adjustment function section 2121 of the reception function section 2120.

Figure 27:
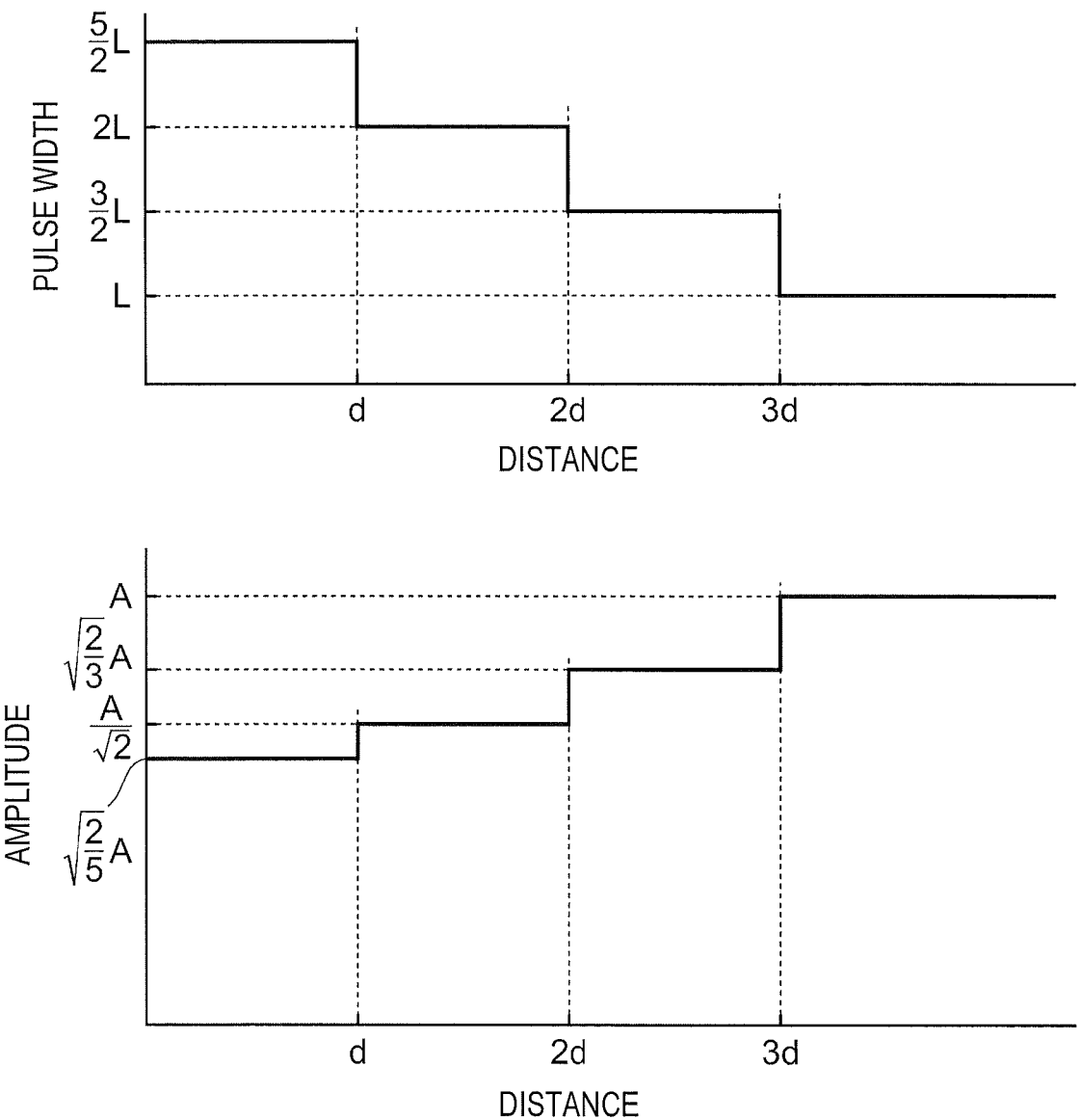
FIG. 27 is a diagram showing a relationship between a communication distance, and the pulse width and amplitude, according to the embodiments.

In the embodiment, the communication distance detection section 2150 detects a communication distance d from another wireless system 2155 which is a correspondent of the communication device 2100, and sends information relating to the detected communication distance to the system controller 2130. The communication distance d can be acquired from a pulse used in communication, by means of a kind of method disclosed in JP-A-2007-142668. The pulse width and amplitude control signal generation section 2131 of the system controller 2130, in accordance with the information relating to the communication distance d, generates the pulse width control signal which adjusts the pulse width and amplitude of the modulated pulse signal. FIG. 27 is a diagram showing a relationship between the communication distance in the embodiments, and the pulse width and amplitude. As shown in the figure, as the communication distance becomes longer, as well as the pulse width narrowing in stages, the amplitude becomes larger in stages. As a result thereof, it is possible to maintain the communication quality even in the event that the communication distance is long.

Also, it is also acceptable to adjust the pulse width in accordance with an amount of data communicated, in place of the heretofore described kind of communication distance d. For example, in a case of carrying out a real-time communication in which a temporal condition of delivering the data to the correspondent is guaranteed, it is also acceptable, in order to improve the communication quality, to narrow the pulse width and reduce a retransmission or the like due to a communication error so as to suppress an increase in traffic. On the other hand, in a case of carrying out a non-real-time communication, as there is room in traffic, it is also acceptable to widen the pulse width in order to suppress interference with another communication.

Figure 28:
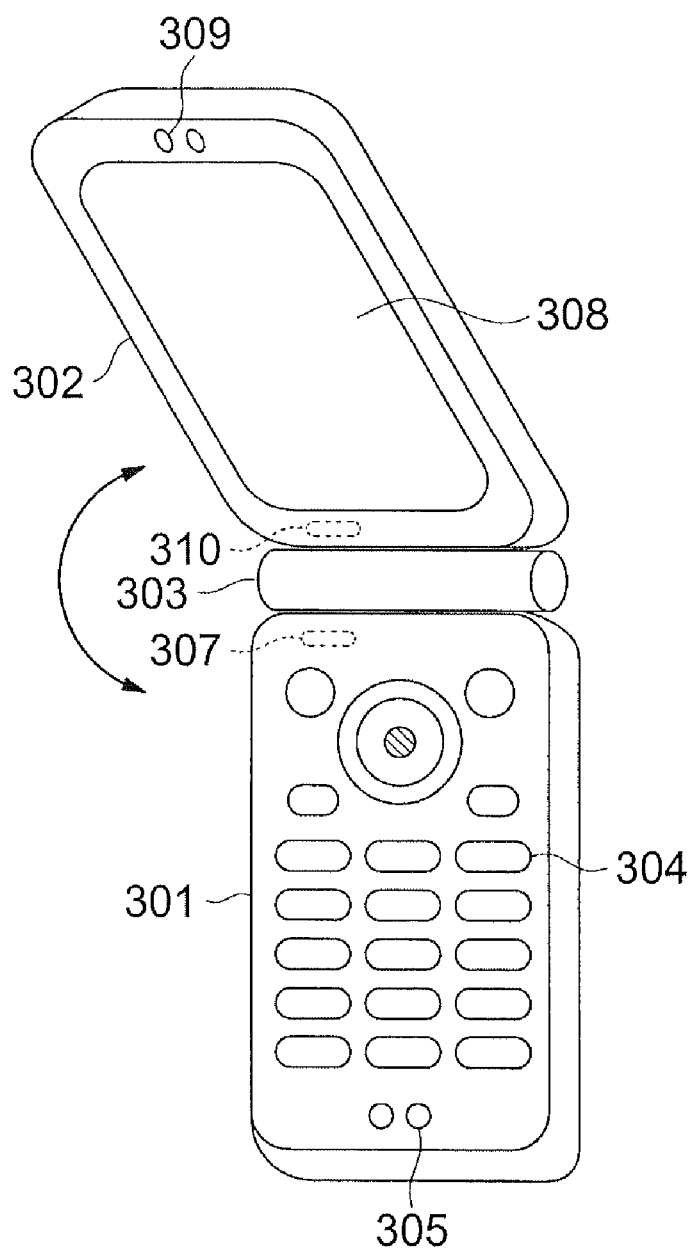
FIG. 28 is a diagram in which the communication device according to the embodiments is applied to a clamshell mobile phone.

Also, it is also acceptable to apply the communication device described in each embodiment to communication between separate function sections in an information terminal device. FIG. 28, being a diagram in which this kind of communication device is applied to a clamshell mobile phone, shows an aspect in which the clamshell mobile phone is opened.

In FIG. 28, as well as operation buttons 304 being disposed on a surface of a first casing 301, a microphone 305 is provided to a lower end of the first casing 301, and an unshown external wireless communication antenna is attached to an upper end of the first casing 301. Also, as well as a display 308 being provided on a surface of a second casing 302 connected to the first casing 301 via a hinge 303, a speaker 309 is provided to an upper end of the second casing 302. Also, the first casing 301 and the second casing 302 are provided with the communication devices (not shown) described in the embodiments and internal wireless communication antennas 307 and 310, respectively, in order to carry out pulse wireless communication between the first casing 301 and the second casing 302.

With this kind of configuration, it is possible to carry out a data transmission between the first casing 301 and the second casing 302. For example, it is possible to send image data and sound data, loaded into the first casing 301 via the external wireless communication antenna, to the second casing 302 by means of internal wireless communication using the internal wireless communication antennas 307 and 310, display an image on the display 308, and output a sound from a speaker 309.

In this case, by adjusting a width or amplitude of a pulse communicated between the first casing 301 and the second casing 302, in accordance with a communication mode, a communication distance, an external electronic device physical condition amount, information a communicated signal bears, or the like, of the mobile phone and a base station, it is possible to suppress the mobile phone and the base station interfering with, or being interfered with, each other. Also, there being no need to carry out the data transmission between the first casing 301 and the second casing 302 by means of a wired connection, eliminating a need to pass a multi-pinned flexible wiring substrate through the hinge 303, it is possible to simplify a structure of the hinge 303.

As heretofore described, the technological idea of the embodiments of the invention described with reference to each figure is a communication method in which, by continuously generating a carrier wave having a certain frequency, in each appropriate one of sequential symbol periods, for a predetermined unit duration time within the symbol period, a modulated pulse signal of an aspect having a pulse width regulated by the unit duration time is used to bear information in sequential segments of a baseband signal corresponding to the sequential symbol periods, and the technological idea can also be summarized as a communication method having features of adjusting a frequency band, occupied by the modulated pulse signal, by adjusting the pulse width of the modulated pulse signal in accordance with a predetermined condition relating to a communication environment.

With this communication method, when communication is carried out in a form in which, by continuously generating a carrier wave having a certain frequency, in each appropriate one of sequential symbol periods, for a predetermined unit duration time within the symbol period, a modulated pulse signal of an aspect having a pulse width regulated by the unit duration time is used to bear information in sequential segments of a baseband signal corresponding to the sequential symbol periods, as the frequency band occupied by the modulated pulse signal is adjusted by adjusting the pulse width of the modulated pulse signal in accordance with the predetermined condition relating to the communication environment, it is possible to carry out communication in which interference with a band used by another communication is effectively suppressed.

The entire disclosure of Japanese Patent Application Nos. 2007-051231, filed Mar. 1, 2007 and 2008-001050, filed Jan. 1, 2008 are expressly incorporated by reference herein.

What is claimed is:

1. A pulse generator which generates a modulated pulse signal by generating a carrier wave having a certain frequency over a predetermined unit duration time, the modulated pulse signal having a pulse width regulated by the predetermined unit duration time, the modulated pulse signal bearing information contained in a baseband signal, the pulse generator comprising: a pulse width adjustment section which adjusts the pulse width by adjusting the predetermined unit duration time of the modulated pulse signal in accordance with a supplied pulse width control signal, wherein the pulse width adjustment section is configured to adjust the pulse width in accordance with a value of an out-of-band noise, further comprising a pulse amplitude adjustment section which adjusts an amplitude of the carrier wave in accordance with the adjustment of the pulse width by the pulse width adjustment section.

2. A communication device comprising: a pulse generator which generates a modulated pulse signal by generating a carrier wave having a certain frequency over a predetermined unit duration time, the modulated pulse signal having a pulse width regulated by the predetermined unit duration time, the modulated pulse signal bearing information contained in a baseband signal, the pulse generator including a pulse width adjustment section which adjusts the pulse width by adjusting the unit duration time of the modulated pulse signal in accordance with a supplied pulse width control signal; and a pulse width control signal generation section which generates the pulse width control signal, wherein the pulse width control signal generation section is configured to adjust the pulse width control signal in accordance with a value of an out-of-band noise, further comprising: an operating condition detection section which detects an operating condition in which an external communication device is in one of a transmission mode, a reception mode or a resting mode, wherein the pulse width control signal generation section is configured in such a way as to generate the pulse width control signal in accordance with the operating condition detected by the operating condition detection section.

3. The communication device according to claim 2, wherein
the pulse width control signal generation section is configured in such a way as to receive a signal emitted from an external electronic device, and generate the pulse width control signal in accordance with information the received signal bears.

4. The communication device according to claim 2, wherein
the pulse width control signal generation section generates the pulse width control signal in such a way that, when the operating condition is in the transmission mode or the reception mode, the pulse width is wider than the pulse width when the operating condition is in the resting mode.

5. The communication device according to claim 2, wherein
the pulse width control signal generation section generates the pulse width control signal in such a way that, when the operating condition is in the reception mode, the pulse width is wider than the pulse width when the operating condition is in the transmission mode.

6. The communication device according to claim 2, further comprising:
a sensor which detects an amount of physical condition of an external electronic device, wherein
the pulse width control signal generation section is configured in such a way as to generate the pulse width control signal in accordance with the physical condition amount detected by the sensor.

7. The communication device according to claim 3, wherein
the pulse width control signal generation section is configured in such a way as to receive a pulse width adjustment request signal emitted from the external electronic device in accordance with a reception quality relating to the received signal, and generate the pulse width control signal in accordance with the received pulse width adjustment request signal.

8. The communication device according to claim 3, further comprising:
a pulse width detection section which detects a pulse width applied to communication from a signal emitted from the external electronic device, wherein
the pulse width control signal generation section is configured in such a way as to generate the pulse width control signal in accordance with the pulse width detected by the pulse width detection section.

9. The communication device according to claim 3, further comprising:
a reception band adjustment section which adjusts a band of the received signal, based on the pulse width adjusted by the pulse width adjustment section.

10. The communication device according to claim 2, further comprising:
a remaining power level detection section which detects a remaining power level, wherein
the pulse width control signal generation section is configured in such a way as to generate the pulse width control signal in accordance with the remaining power level detected by the remaining power level detection section.

11. The communication device according to claim 2, further comprising:
a communication distance detection section which detects a communication distance from the external communication device, wherein
the pulse width control signal generation section is configured in such a way as to generate the pulse width control signal in accordance with the communication distance detected by the communication distance detection section.

12. The communication device according to claim 3, further comprising:
a pulse width signal reception section which receives a pulse width signal which, representing the pulse width, is transmitted; and
a reception band adjustment section which adjusts the band of the received signal, based on the pulse width represented by the received pulse width signal.

13. The communication device according to claim 2, wherein the pulse generator generates the modulated pulse signal according to an ultra-wide band method.

14. A pulse generator generating a pulse, regulated by a carrier wave on which information to be transmitted is superimposed, the pulse having a width equal to a length of a predetermined number of cycles of the carrier wave, the pulse generator generating the pulse in accordance with a value of an out-of-band noise, further comprising:
an oscillator that continuously generates the carrier wave;
a gating unit that generates a modified carrier wave by selectively passing through the carrier wave for a period of time based on the predetermined number of cycles; and
a mixer that generates the pulse by multiplying the modified carrier wave with a baseband signal representing the information to be transmitted,
wherein the gating unit generates the modified carrier wave based on value of an out-of-band noise.

* * * * *